United States Patent [19]

Temple

[11] 4,417,385
[45] Nov. 29, 1983

[54] PROCESSES FOR MANUFACTURING INSULATED-GATE SEMICONDUCTOR DEVICES WITH INTEGRAL SHORTS

[75] Inventor: Victor A. K. Temple, Clifton Park, N.Y.

[73] Assignee: General Electric Company, Schenectady, N.Y.

[21] Appl. No.: 406,731

[22] Filed: Aug. 9, 1982

[51] Int. Cl.$^3$ .......................................... H01L 21/265
[52] U.S. Cl. ..................................... 29/571; 29/576 B; 29/579; 29/580; 29/591; 148/187
[58] Field of Search ............. 29/571, 578, 580, 576 B, 29/579, 591; 357/38, 23 VD; 148/1.5, 187, 190

[56] References Cited

U.S. PATENT DOCUMENTS

| 4,084,986 | 4/1978 | Aoki et al. ............................. 148/1.5 |
| 4,148,054 | 4/1979 | Hart et al. .......................... 148/175 X |
| 4,232,439 | 11/1980 | Shibata ............................... 29/576 B |
| 4,242,791 | 1/1981 | Horng et al. ....................... 29/580 X |
| 4,290,844 | 9/1981 | Rotolante et al. ................ 148/1.5 X |
| 4,319,395 | 3/1982 | Lund et al. ........................ 29/579 X |
| 4,344,081 | 8/1982 | Pao et al. ......................... 357/23 VD |
| 4,345,265 | 8/1982 | Blanchard ...................... 357/23 VD |

OTHER PUBLICATIONS

Leung et al., "Refractory Metal Silicide/N+Polysilicon in CMOS/SOS," Technical Digest of International Electron Devices Meeting, Washington D.C., Dec. 8, 1980, Institute of Electrical and Electronics Engineers, Piscataway, N.J., pp. 827-830.
J. F. Gibbons, "Ion Implantation in Semiconductors—Part I: Range Distribution Theory and Experiments", Proceedings IEEE, vol. 56, No. 3, pp. 295-319 (Mar. 1968).
J. F. Gibbons, "Ion Implantation in Semiconductors—Part II: Damage Production and Annealing", Proceedings IEEE, vol. 60, No. 9, pp. 1062-1096 (Sep. 1972).
J. Hui, T. Y. Chiu, S. Wong, and W. G. Oldham, "Selective Oxidation Technologies for High Density MOS", IEEE Electron Device Letters, vol. EDL-2, No. 10, pp. 244-247 (Oct. 1981).
Specification & drawings of copending U.S. patent application Ser. No. 324,328, filed 11-23-81, by B. J. Baliga, "Methods for Fabricating Vertical Channel Buried Grid Field Controlled Devices Including Field Effect Transistors and Field Controlled Thyristors".
Specification & Drawings of copending U.S. patent application Ser. No. 324,163, filed 11-23-81, by B. J. Baliga et al., "Vertical Channel Field Controlled Device Employing a Recessed Gate Structure and Methods of Making".
Specification & drawings of copending U.S. patent application Ser. No. 336,972, filed 1-4-82 by R. P. Love, "Self-Aligned Power MOSFET with Integral Source-Base Short and Methods of Making".

Primary Examiner—G. Ozaki
Attorney, Agent, or Firm—Charles E. Bruzga; James C. Davis, Jr.; Marvin Snyder

[57] ABSTRACT

Processes for manufacturing insulated-gate semiconductor devices characterized by involving a minimal number of photolithographic masking steps and being fail-safe in a number of respects. A number of process alternatives are disclosed for forming a shorting extension of a base region up through and to a portion of the surface of a source region, many of these process alternatives involving self-masking techniques to define the source region surface portion. Two general MOSFET structures are formed in accordance with the procedures of the invention. One structure has metallized gate terminal fingers, and is formed employing one-mask processes. The other structure has gate fingers encased in insulating oxide and connected to remote gate contacts. For both structures, selective oxidation of the polysilicon gate electrode material is preferred, and various approaches to this selective oxidation are described.

35 Claims, 41 Drawing Figures

A-A PROFILE

B-B PROFILE

ETCH AND UNDERCUT

ETCH AND UNDERCUT

ANGLED ION IMPLANTATION FOR BASE AND SOURCE

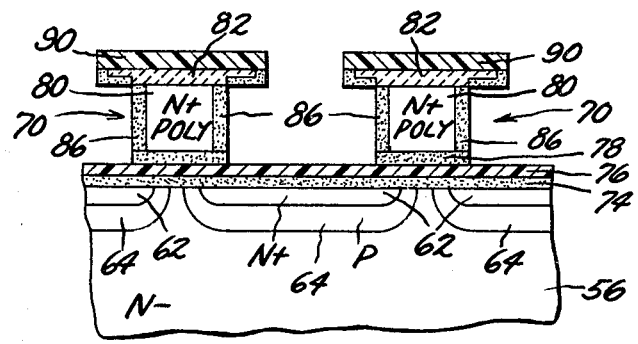
FIG. 6 — SELECTIVE OXIDATION
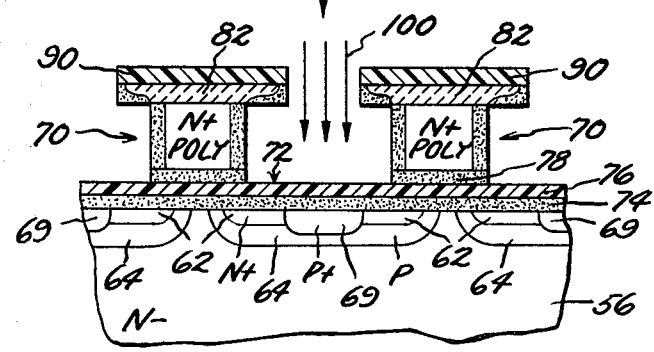
FIG. 7 — VERTICAL ION IMPLANTATION FOR SHORT
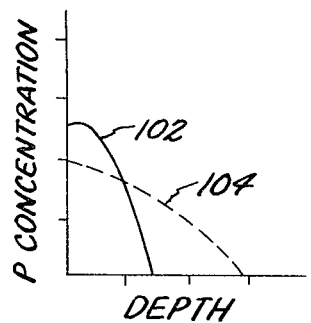
FIG. 8A
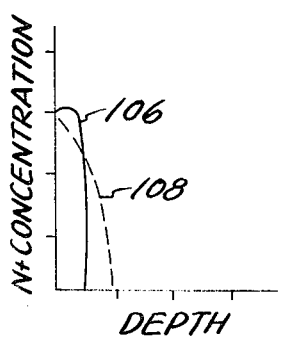
FIG. 8B
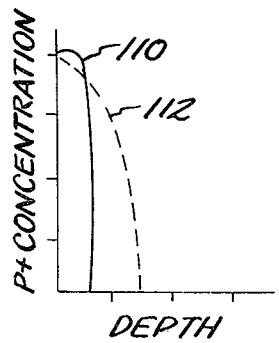
FIG. 8C

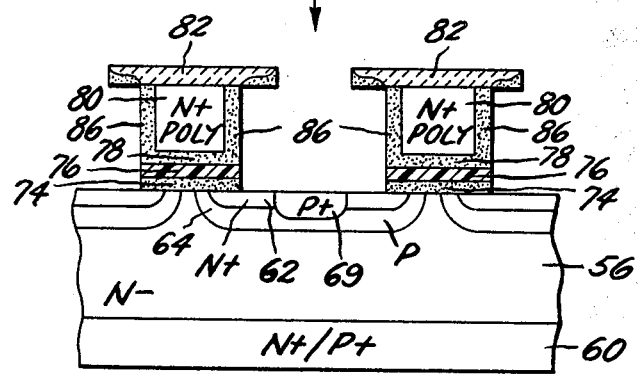
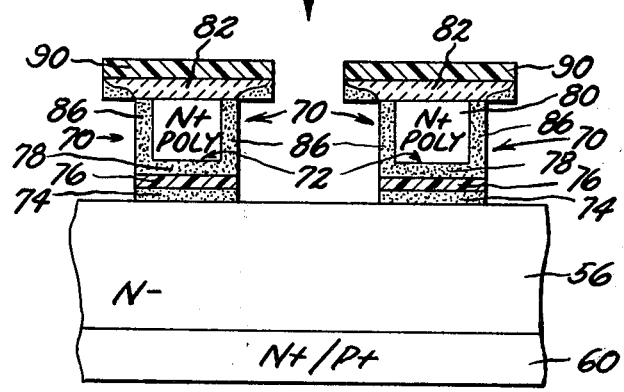
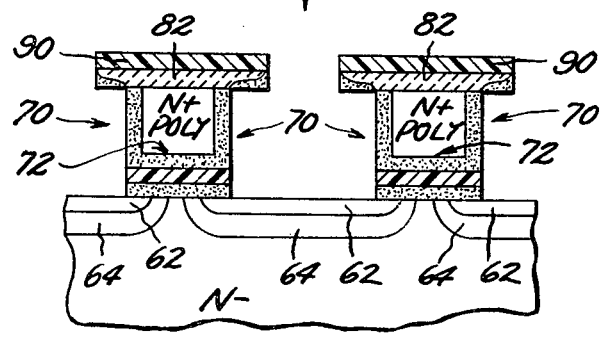

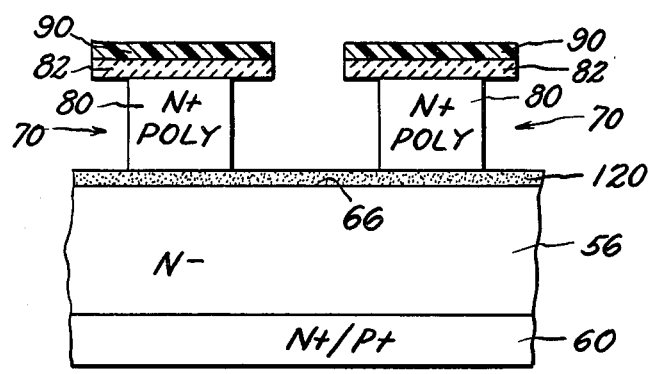
FIG. 12 | PREPARATION UNDERCUT ETCH
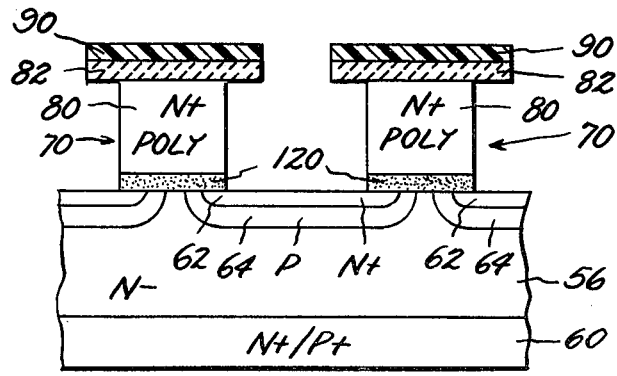
FIG. 13 | SELECTIVE ETCH DIFFUSIONS

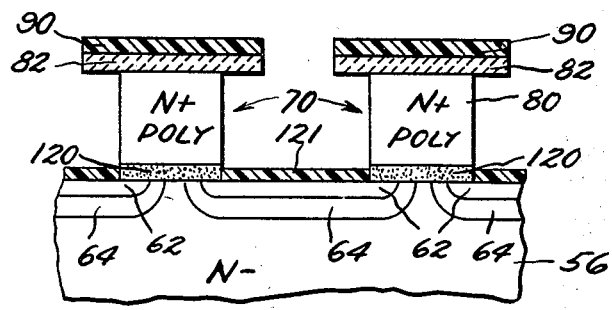
FIG. 14 — FORM NITRIDE OXIDATION BARRIER
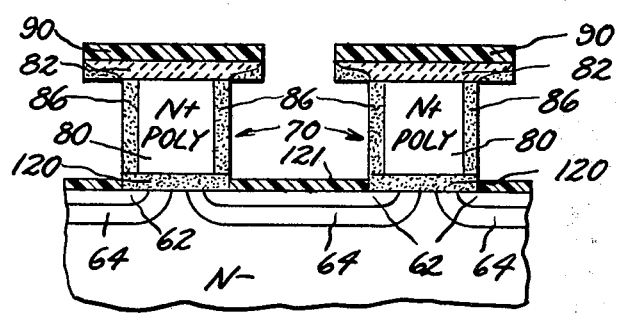
FIG. 15 — SELECTIVE OXIDATION
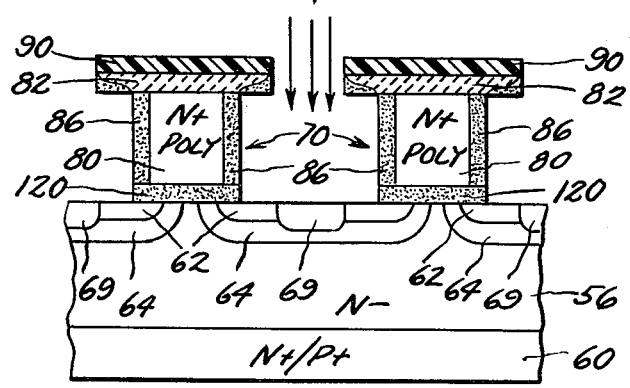
FIG. 16 — SHORT IMPLANT REMOVE NITRIDE

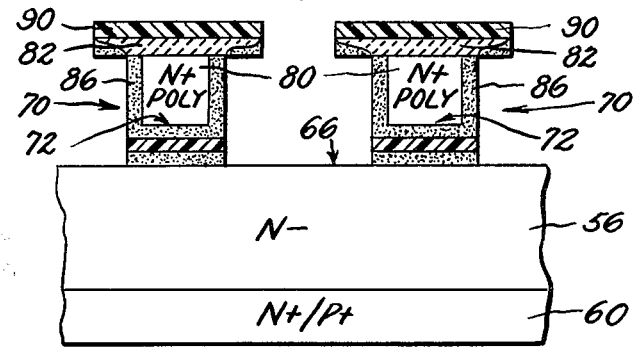
FIG. 17 — PREPARATION & ETCH SELECTIVE OXIDATION SELECTIVE ETCH
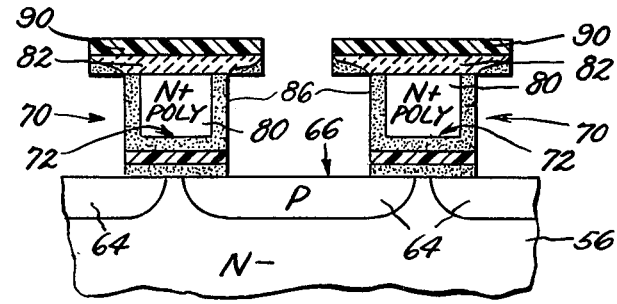
FIG. 18 — FORM BASE REGION
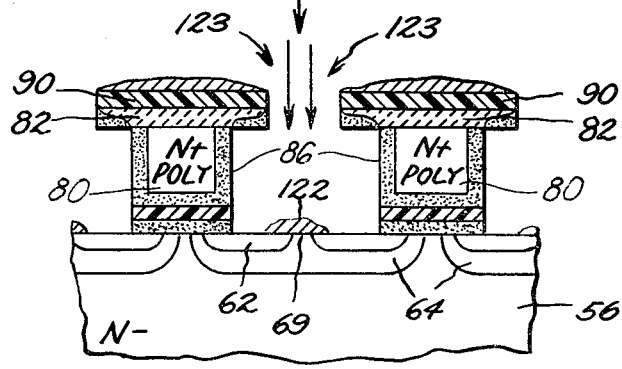
FIG. 19 — DEPOSIT SELF-REGISTERED METAL MASK

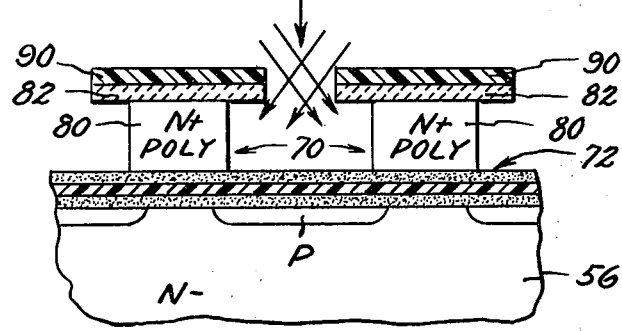
FIG. 20 PREPARATION & ETCH ANGLED BASE IMPLANT
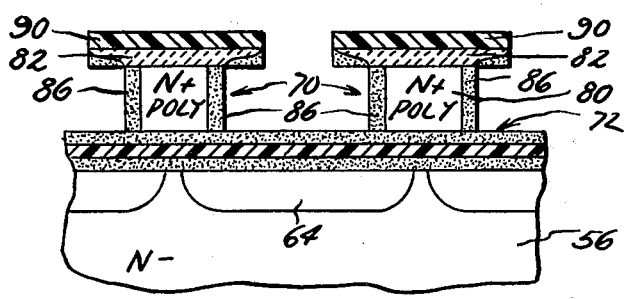
FIG. 21 DRIVE IMPLANT SIDEWALL OXIDATION
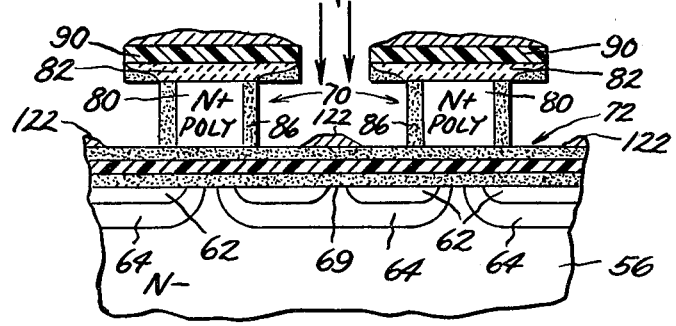
FIG. 22 DEPOSIT SELF REGISTERED METAL MASK ANGLED SOURCE IMPLANT

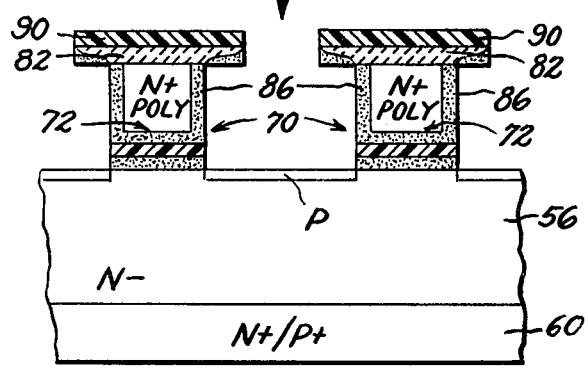
FIG. 23 INITIAL PREPARATION ETCH SELECTIVE OXIDATION BASE PRE-DEPOSITION
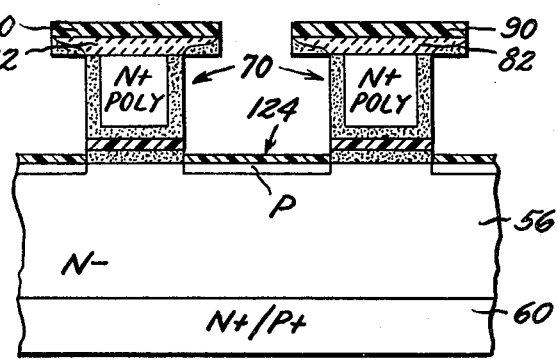
FIG. 24 DEPOSIT NITRIDE
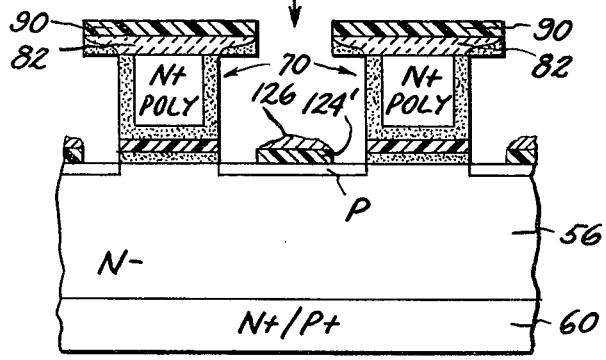
FIG. 25 DEPOSIT METAL ETCH NITRIDE
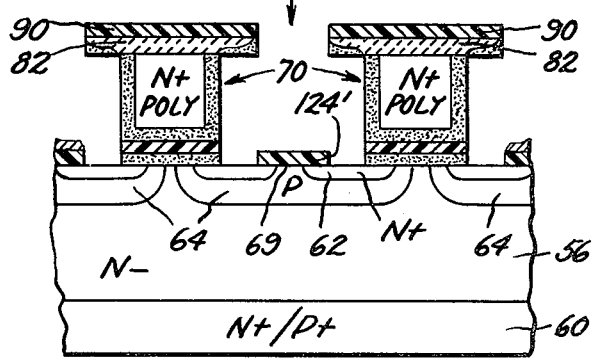
FIG. 26 REMOVE METAL SOURCE DIFFUSION

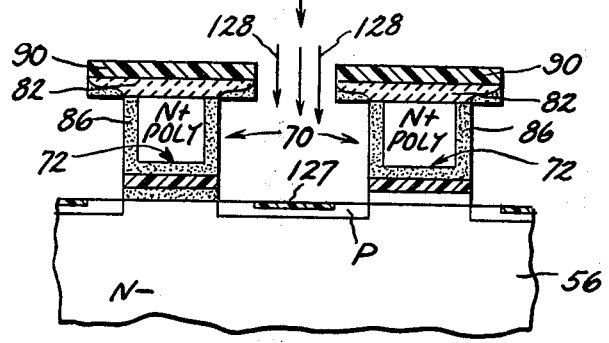
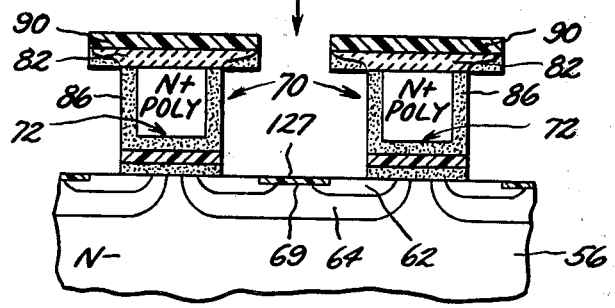
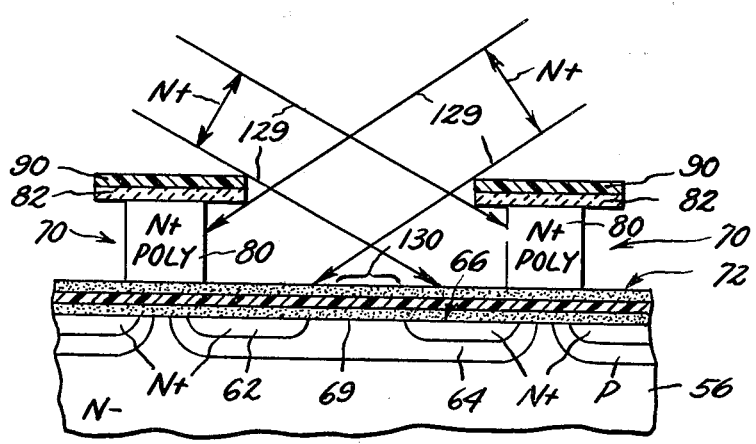

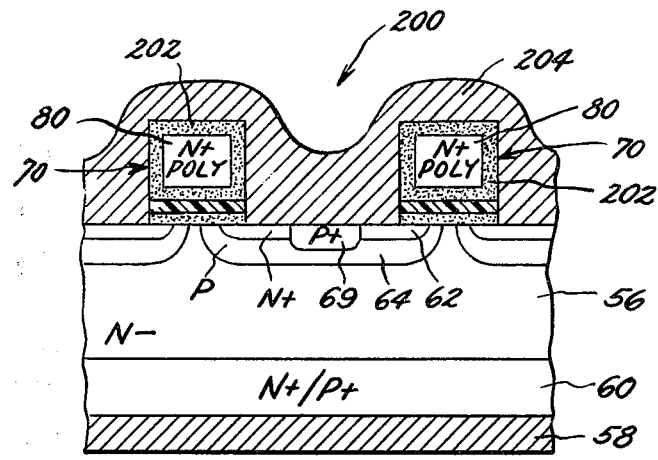
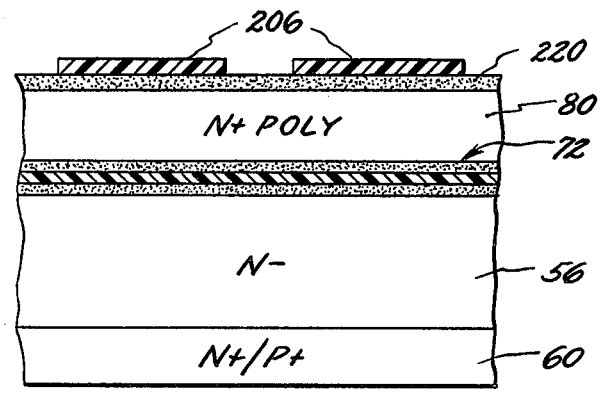
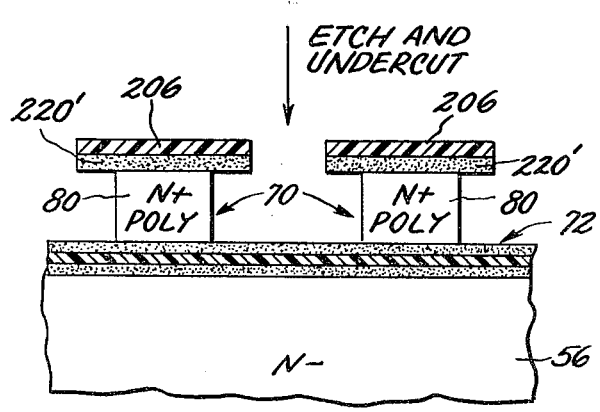
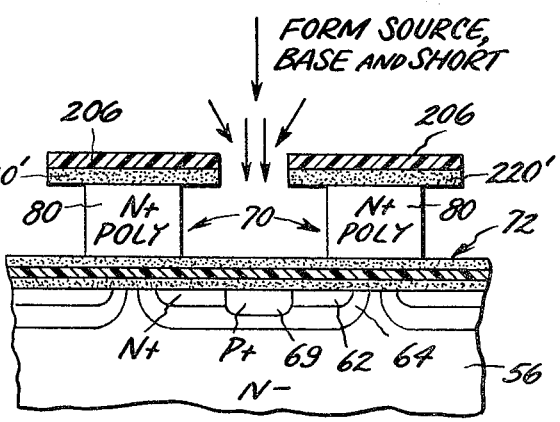

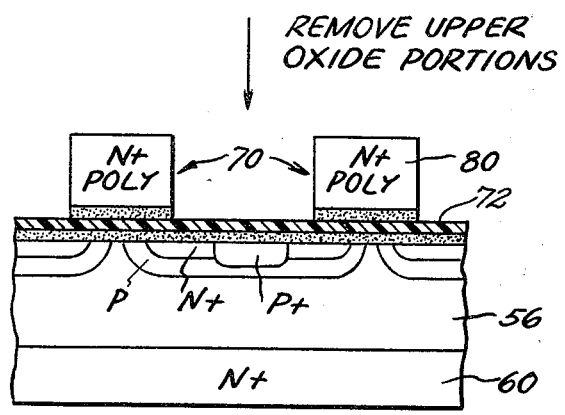
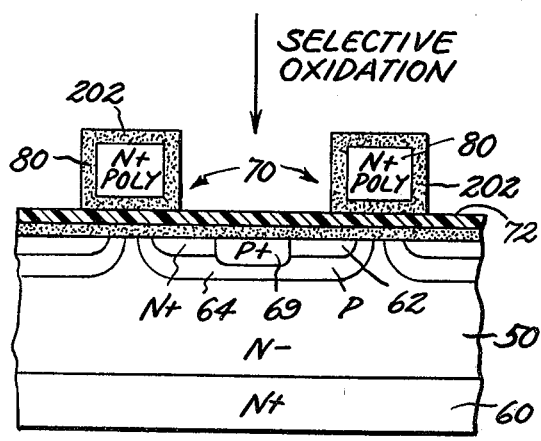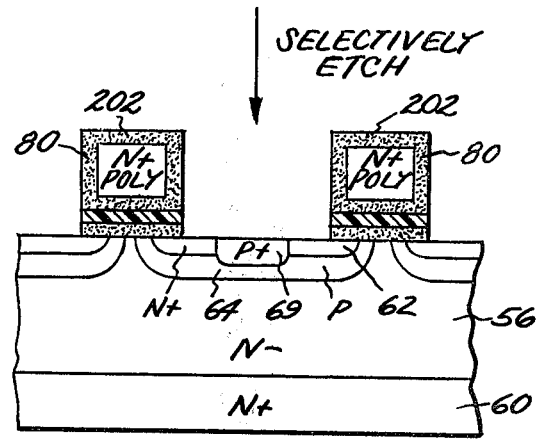
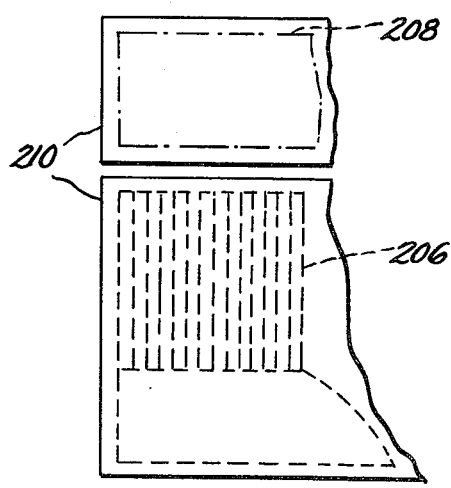

PROCESSES FOR MANUFACTURING INSULATED-GATE SEMICONDUCTOR DEVICES WITH INTEGRAL SHORTS

CROSS-REFERENCE TO RELATED APPLICATIONS

Various alternative processes are disclosed in commonly-assigned U.S. patent application Ser. No. 406,738, filed concurrently herewith, by Victor A. K. Temple, and entitled "SELF-ALIGNED, MINIMAL MASK PROCESS EMPLOYING A TWO-STEP ETCH FOR MANUFACTURING INSULATED-GATE SEMICONDUCTOR DEVICES WITH INTEGRAL SHORT", which is a continuation of U.S. patent application Ser. No. 396,226, filed on July 8, 1982 and now abandoned; and in commonly-assigned U.S. patent application Ser. No. 406,734, filed concurrently herewith by Victor A. K. Temple, and entitled "SELF-ALIGNED, MINIMAL MASK PROCESS EMPLOYING A TWO-STEP ETCH AND A COMBINED DIFFUSION AND SELECTIVE OXIDATION BARRIER FOR MANUFACTURING INSULATED-GATE SEMICONDUCTOR DEVICES WITH INTEGRAL SHORTS", which is a continuation of U.S. patent application Ser. No. 346,172, filed on July 7, 1983 and now abandoned. The entire disclosures of application Ser. Nos. 406,738 and 406,734 are hereby expressly incorporated by reference herein.

BACKGROUND OF THE INVENTION

The present invention relates generally to processes for manufacturing insulated-gate power semiconductor devices such as MOSFETs, as well as other more complex devices including MOSFET-like structures, such as Insulated Gate Rectifiers and MOS-gated Thyristors. The invention more particularly relates to such processes resulting in minimal cell size devices, characterized by involving a minimal number of photolithographic masking steps, by having self-aligned source-base shorts, thereby reducing the minimum cell size, and by being fail-safe in a number of respects so as to provide a relatively high process yield.

Known power MOSFETs generally comprise a multiplicity of individual unit cells (sometimes numbering in the thousands) formed on a single silicon semiconductor wafer in the order of 300 mils (0.3 in.) square in size and electrically connected in parallel. Each cell is typically about thirty microns in width. A number of geometric arrangements for the unit cells are possible, including elongated strips.

One particular known process for manufacturing power MOSFETs is a double diffusion technique which begins with a common drain region of, for example, N conductivity type semiconductor material, in turn formed on an N+ conductivity type substrate. Specifically, within the drain region a base region is formed by means of a first diffusion to introduce impurities of one type and then a source region is formed entirely within the base region by means of a second diffusion to introduce impurities of opposite type. If the drain region is N type, then the first diffusion is done with acceptor impurities to produce a P type base region, and the second diffusion is done with donor impurities to produce an N+ type source region. At the drain region surface, the base region exists as a band between the source and drain regions.

Conductive polysilicon gate electrodes are formed on the surface over the base region band and separated by a gate insulating layer. When voltage of proper polarity is applied to the gate electrodes during operation, an electric field extends through the gate insulating layer into the base region forming a conductive channel just under the surface. Current flows horizontally between the source and drain region through the conductive channel.

To form the gate insulating layer and gate electrode structure, during initial wafer preparation a uniform gate insulating oxide layer and then a uniform layer of highly-doped polysilicon are grown over the drain region, prior to any introduction of impurities to form the base and source regions. Channels are then etched through the polysilicon layer and the gate insulating oxide to define the polysilicon electrodes spaced along the drain region.

In a power MOSFET structure, the source, base and drain regions correspond respectively to the emitter, base and collector of a parasitic bipolar transistor. As is known, if this parasitic bipolar transistor is allowed to turn on during operation of the power MOSFET, the blocking voltage and the dV/dt rating of the power MOSFET are substantially degraded. Accordingly, in order to prevent the turn on of the parasitic bipolar transistor during operation of the power MOSFET, the layers comprising the source and base regions are normally shorted together by means of an ohmic connection.

This same general MOSFET structure can be included in other, more complex devices. For example, rather than an N+ conductivity type substrate, a P+ conductivity type substrate may be employed, which becomes the anode region of an Insulated Gate Rectifier (IGR). The previous N conductivity-type drain region is formed as before, but is more generally termed herein a "first region", while the P+ conductivity type anode is herein termed a "second region". The P conductivity-type base region is formed as before in the first region, and the N+ conductivity-type region is formed in the base region. In the case of an IGR, this latter N+ conductivity type region is not termed a source region as before, but rather is a rectifier cathode region or, more generally, an upper electrode region.

As another example, a third device region, of N+ conductivity type, may be provided below the more lightly doped type second region to form the lower main electrode region of an MOS-gated thyristor.

In all of these cases, it will be appreciated that the MOS gate structure is essentially identical, and that the only substantial variations in the overall device structure are in the layers below the first region. In all cases, a short between the upper electrode region (whether it is termed a MOSFET source, an IGR cathode, or a MOS-gated thyristor) and the base region is desired. In all cases, device terminal metallization is connected to the upper electrode region and the gate electrodes.

For convenience, the invention is described herein primarily in the context of a MOSFET. However, it will be appreciated in view of the foregoing that the invention is equally applicable to various other insulated-gate semiconductor devices.

Known power MOSFET designs in manufacture typically require five to seven masking steps, some of which must be aligned to each other with high accuracy to produce working devices. In particular, to form the source-base short, between the first and second diffusion steps a diffusion barrier is applied by means of selective masking over a portion of the base diffusion surface area to prevent the subsequent source diffusion from entering the base diffusion in the area. Thereafter, metallization is applied for the source electrode, and a portion of the source metallization also makes ohmic contact with the previously masked area of the base region.

The large number of masking steps and need for alignment in the prior art processes decrease the process yield. Further, due to the need to provide tolerance for misalignment, unit cell size is larger than would otherwise be needed, undesirably increasing spreading resistance effects. Additionally, prior art process generally provide encased gate electrode structures having remote gate electrode contacts, thus increasing the gate input impedance.

SUMMARY OF THE INVENTION

Accordingly, it is an object of the invention to provide processes for manufacturing insulated-gate semiconductor devices requiring a minimal number of photolithographic masking steps, thereby improving process yields.

It is another object of the invention to provide processes for forming a self-aligned source-to-base shorts in MOSFETs and other insulated-gate semiconductor devices without requiring any additional masking step with attendant need for alignment, thereby also improving process yields and maintaining minimal cell size.

It is yet another object of the invention to provide insulated-gate semiconductor device manufacturing processes which are fail-safe in nature.

It is yet another object of the invention to provide methods for forming power insulated-gate semiconductor devices having low gate input resistance for high frequency operation.

It is another object of the invention to provide processes for opening contacts to source and base shorting extensions of each unit cell without masking steps.

Briefly, in accordance with one concept of the invention, insulated gate semiconductor devices are manufactured beginning with a semiconductor wafer, such as silicon, including a first device region such as a MOSFET drain region, a gate insulating layer initially formed uniformly on the surface of the drain region, and a conductive gate electrode layer, such as polysilicon, formed on the gate insulating layer. Through subsequent masking and etching steps, channels are etched through the gate electrode layer and then on through the gate insulating layer to the drain region. The unetched portions define gate electrodes spaced along the drain region. Employing these gate electrodes as masks, impurities are introduced into the drain region through the surface between the gate electrodes, and then driven by thermal diffusion to form appropriately located base and source regions. Each source region is located both laterally and vertically within the corresponding base region. In accordance with various specific processes of the invention, these base and source impurities are introduced either by ion implantation, or from a gas source, or a combination of the two. In the case of ion implantation, the impurities in some process variations are introduced through the gate insulating layer.

In accordance with another overall concept of the invention, a shorting extension of the base region up through and to a portion of the surface of the source region is formed by means of a self-masking technique to define the source region surface portion. More particularly, prior to initial masking and etching, an overhang layer is formed on top of the polysilicon gate electrode layer. The overhang layer may be a conductive one which survives through the entire process and becomes a part of the gate electrode structure of the finished device (e.g., a refractory metal such as tungsten, molybdenum or platinum, or a refractory metal silicide such molybdenum silicide), or this overhang layer may be a temporary layer of a material such as silicon nitride, silicon dioxide, or sandwich of these two materials. In either event, the overhang layer is deliberately undercut during the etching of the polysilicon gate electrode layer such that overhanging portions of this other layer remain on the upper surfaces of the polysilicon gate electrodes. During vertically directed ion implant or material deposition processes, the overhang (or, stated differently, the opening between opposing overhangs) defines the portion of the surface portion where the shorting extension is formed.

The invention contemplates a variety of specific processes for forming the shorting region employing the overhang. In one specific process, the shorting region impurities are introduced by means of vertically directed ion implantation. In this connection it should be noted that, in the event the base and source region impurities are introduced by ion implantation, due to the overhang these base and source region impurities must be introduced at angles so as to cover the entire drain region between the gate electrodes.

In one alternative process for forming the shorting region employing the overhang, subsequent to the introduction of base region impurities, a self-registered implant mask is formed over a portion of the surface between the gate electrodes by depositing evaporated metal substantially vertically. Upon subsequent implantation of the source region impurities, the area protected by the self-registered implant mask is not implanted.

In another alternative process for forming the shorting region employing the overhang where the source region is to be formed by gas source diffusion, base region impurities are first deposited on the exposed semiconductor surface between the gate electrodes, and then a uniform silicon nitride layer is formed. Then, a self-registered etchant mask is formed over only a portion of the silicon nitride layer by depositing evaporated metal vertically. Then, the silicon nitride layer is selectively etched except where masked by the metal etchant mask, and the metal etchant mask is removed, leaving a silicon nitride diffusion mask. Source region impurities are then introduced from a gas source, except where masked by the nitride diffusion mask.

Yet another alternative process for forming the shorting region employing the overhang where the source region is to be formed by gas source diffusion differs from the alternative briefly described immediately above in that a silicon nitride diffusion mask is formed directly by vertical implantation of nitrogen ions just slightly into the surface of a portion of the silicon region between the gate electrodes. The intermediate metal etchant mask is avoided, but at the potential expense of higher source contact resistance because it may not be possible to completely remove the implanted silicon nitride.

In accordance with an alternative concept of the invention for forming the shorting extension, the source region impurities are introduced by ion implantation at sharp angles such that an intermediate portion of the surface between the gate electrodes is not implanted at all due to the shadow masking by the electrodes themselves. With this method, the overhang is not needed, but may be of benefit depending on the particular geometry of the device, particularly as an aid in automatic metallization separation.

There are two general device structures which are formed in accordance with the processes of the invention. The first general structure has metallized gate terminal fingers for low gate input resistance, and separate metallized source terminal fingers in the channel bottoms in ohmic contact with the source regions and with the shorting extensions. This form of device preferably has three conductive gate layers, and can be fabricated employing only a single mask. More particularly, the first conductive gate layer is polysilicon. The second is the overhang layer which, in this form of the invention, is a conductive layer which survives through the entire process. The third layer is the gate metallization itself. Employing the processes briefly summarized above, and advantageously using the overhang of the second conductive layer created while forming the source-to-base short, the single mask is sufficient to define all the active regions of the device. During metallization, metal is evaporated onto the entire surface of the wafer, and automatically separates into upper fingers for the gate metallization and lower fingers in the channels for the source metallization. Thus, no mask is required for metal definition.

The second conductive gate layer may simply be a refractory metal layer, for example, platinum, molybdenum, or tungsten. Preferably, these metals are protected from oxidation during processing by another layer comprising silicon nitride. Rather than a refractory metal, molybdenum silicide may be employed as the second conductive gate layer, also preferably protected by a silicon nitride layer.

The second general form of device structure formed in accordance with the processes of the invention has polysilicon gate electrode structures which are encased in insulating oxide and connected to remote gate contacts. Source metallization covers the entire active device area. While all critically-aligned steps are done employing the first mask, two additional masks are for providing a window through the encasing oxide to form the gate contact on a portion of the wafer away from the active portion of the device, and for separating the metallization into source and gate contact areas.

In preferred processes of the invention, both forms of device require selective oxidation of the polysilicon gate sidewalls without oxidation of the surface of the source region. The second form of device requires oxidation of the polysilicon gate upper surfaces as well. In accordance with the invention, two general approaches to such selective oxidation are provided.

In the first approach, a silicon nitride layer is included in the gate insulating layer. Selective oxidation of the polysilicon gate electrodes is accomplished by heating in the presence of the oxygen prior to removal of the gate insulating layer over the source region. Thus, oxidation of the source region is masked by the nitride layer. In the case of the first general form of MOSFET structure, oxidation of the polysilicon gate electrode upper surface is masked by the second conductive gate layer portions, which preferably are protected during these steps by a nitride layer.

In the second selective oxidation approach of the invention, no nitride is included in the gate insulating layer. This can be a benefit in terms of performance of the finished device due to unstable charges which can exist in nitride/oxide sandwiches. Instead, a nitride oxidation mask layer is formed over the source region later. This nitride oxidation mask layer may for example be formed by ion implantation or by low pressure vapor deposition.

The processes of the invention may be relaxed somewhat, at the expense of requiring another masking step, by eliminating any silicon nitride oxidation mask layer over the source region and allowing the source region source to oxidize. To provide source contact windows the oxide is etched employing a mask. While an additional aligned mask step is required, the source-to-base short is still formed without need for a masking step.

One of the advantages of the present invention is the fail-safe nature of many of the processes described. While an individual unit cell may not be perfectly formed, the entire device will not be failed. Higher process yields thus result. One such example is a photoresist error in the first mask, such as resist being present where it should not be, or not being present where it should be. In such an event, a unit cell may be inoperative, but the device as a whole will be operable. Another example is a failure to undercut in some portion of the device. Yet another example is a failure to provide a source-to-base short in some area of the device.

The potentially fatal failure modes are relatively few. One fatal failure is a metallization error, where the source and gate metallization connect, shorting the device. Another is a source-to-drain short which could occur if an angled implant for the base region does not reach all the way under an overhang, leaving the drain region exposed to source metallization. The possibility of this happening is minimal because the base region is driven relatively far during thermal diffusion, and thus is likely to cover the required area. Also, the processes of the invention wherein the base region is formed by the gas source diffusion substantially eliminate this possibility.

BRIEF DESCRIPTION OF THE DRAWINGS

While the novel features of the invention are set forth with particularity in the appended claims, the invention, both as to organization and content, will be understood and appreciated, along with other objects and features thereof, from the following detailed description, taken in conjunction with the drawings, in which:

FIG. 6 depicts a step of selectively oxidizing polysilicon gate sidewalls;

FIG. 7 depicts a step of forming a shorting extension of the base region by means of ion implantation vertically;

FIGS. 8A, 8B and 8C depict ion implantation dosages as a function of depth for the channel, source and short implants, respectively, the solid lines representing the actual implant concentration, and the dash lines depicting concentration after thermal diffusion;

FIG. 9 depicts a step of selectively etching to expose silicon in the source area prior to metallization;

FIG. 10 depicts an intermediate step in a process variation wherein the base and source regions are formed by gas source diffusion, rather than by ion implantation;

FIG. 11 depicts base and source regions formed by gas source diffusion;

FIG. 12 depicts the initial steps of another variation in accordance with the invention which permits selective oxidation of the polysilicon gate sidewalls while avoiding silicon nitride in the gate insulating oxide;

FIG. 13 depicts the FIG. 12 wafer after etching of the gate oxide layer and the formation of diffused base and source regions;

FIG. 14 depicts the formation of a nitride selective oxidation mask over the source region of the FIG. 12 wafer;

FIG. 15 depicts a step of selectively oxidizing polysilicon gate electrode sidewalls of the FIG. 12 wafer;

FIG. 16 depicts steps of implanting a short region and etching nitride from over the source region of the FIG. 12 wafer;

FIG. 17 depicts initial preparation steps in accordance with yet another variation in accordance with the invention wherein a source-to-base short is formed without the use of an implant for forming the shorting region;

FIG. 18 depicts a gas source diffusion of the FIG. 17 wafer to form a base region;

FIG. 19 depicts steps of depositing a self-registered refractory metal mask, and then implanting source region impurities in areas unprotected by this mask on the FIG. 17 wafer;

FIG. 20 depicts initial preparation steps in accordance with yet another variation of the invention which avoids an implant to form the source-to-base short;

FIG. 21 depicts steps of selectively oxidizing a polysilicon gate sidewalls and thermally diffusing the base region impurities in the FIG. 20 wafer;

FIG. 22 depicts comparable to the steps of FIG. 19 of depositing a self-registered metal mask, and then implanting source region impurities in areas not covered by the mask on the FIG. 20 wafer;

FIG. 23 depicts an initial step in a process variation which avoids the need for an implant for forming the source-to-base short and which permits the source region to be formed employing gas source diffusion;

FIG. 24 depicts a step of depositing a nitride layer on the wafer of FIG. 23;

FIG. 25 depicts steps of depositing a self-aligned aluminum mask over the nitride, with subsequent etching of the nitride on the FIG. 23 wafer;

FIG. 26 depicts steps of forming a diffused source region with a nitride mask for leaving a shorting contact area on the FIG. 23 wafer;

FIG. 27 depicts an alternative to the steps of FIGS. 24-25 involving an implanted nitride diffusion mask;

FIG. 28 depicts a diffusion step following FIG. 27;

FIG. 29 depicts yet another alternative for forming a base-to-source short by implanting the source region at rather sharp angles;

FIG. 30 is a cross section of the active portion of a second general form of MOSFET fabricated in accordance with an exemplary three-mask process of the present invention, the FIG. 30 MOSFET having gate electrodes encased in insulating oxide and connected to remote gate contacts;

FIG. 31 depicts an initial preparation step in accordance with a three-mask process of the invention;

FIG. 32 depicts the FIG. 31 wafer after undercut etching;

FIG. 33 depicts the FIG. 31 wafer after angled implantation of base and source regions, and vertical implantation of shorting regions;

FIG. 34 depicts the FIG. 31 wafer after removal of photoresist and oxide layers;

FIG. 35 depicts the FIG. 31 wafer after selective oxidation to encase the gate electrodes;

FIG. 36 depicts the FIG. 31 wafer after etching of the gate oxide to expose the source region just prior to metallization to form the FIG. 30 structure; and FIG. 37 is a plan view depicting, in overlapping registration form, three successive masks to form the device depicted in FIG. 30.

DETAILED DESCRIPTION OF THE PREFERRED EMBODIMENTS

Preliminarily, it should be noted that for convenience the devices and fabrication processes of the invention are described herein primarily in the context of a MOSFET having N+ conductivity type source, P conductivity type semiconductor base or channel regions, and N− conductivity type semiconductor drain regions. More generally, the processes of the invention are described in the context of an insulated-gate semiconductor device having an N+ conductivity type upper terminal region, a P conductivity type base region, and an N conductivity type first region. It will be appreciated, however, that the invention is equally applicable to devices wherein the active regions formed are of opposite conductivity type.

Two general forms of insulated-gate semiconductor are described herein, together with a variety of processes and process variations for manufacturing each form. Most of the processes and process variations are equally applicable to either general form of device, as will hereafter become apparent.

The first general form of device is described herebelow with reference to FIGS. 1, 2A and 2B, and manufacturing processes are described hereinbelow with reference to FIGS. 3–29. The first form of device is characterized by having metallized gate terminal fingers for low gate input resistance to permit high frequency operation. In preferred forms, there are three conductive layers in the gate electrode structure. The first form of device is fabricated employing one-mask processes as described herein.

The second general form of device is described hereinbelow with reference to FIG. 30, and manufacturing processes are described in particular with reference to FIGS. 31–37. The second general form of device is characterized by having gate electrodes encased in insulation oxide, in turn surrounded by upper terminal region metallization. Remote gate contacts are employed. There need be only a single conductive layer in the gate electrode, although some forms employ a second layer for lower gate input resistance. The second form of device is fabricated employing three-mask processes as described.

It should further be noted that the processes as described in detail below are the specific forms which are presently preferred. It will be appreciated, however, that the processes and process variations may be employed in combinations other than those specifically described hereinbelow and, further, that the various process steps may be done in a number of cases in an order different than those which are specifically described herein.

Metallized Gate Electrode Devices

Figure 1:
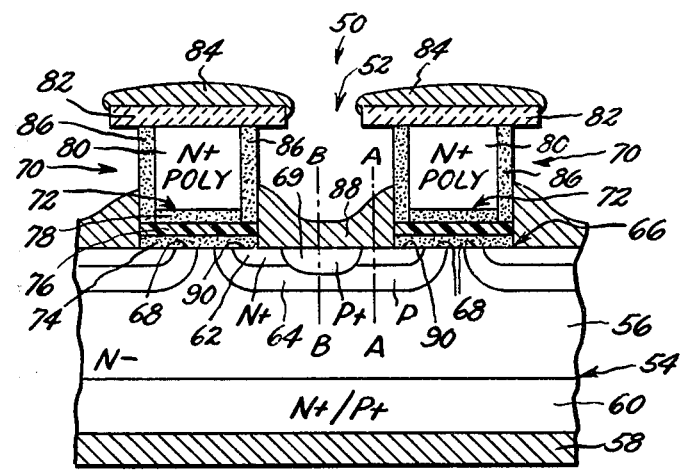
FIG. 1 is a cross-sectional view of the active portion of a first general form of MOSFET fabricated in accordance with single-mask processes of the present invention, the FIG. 1 MOSFET having metallized gate terminal fingers and characterized by having three conductive gate electrode layers.

Referring now to FIG. 1 in detail, shown in partial cross section is the active portion of a power MOSFET 50, with one unit cell 52 completely shown, and adjacent unit cells partially shown. As is known, a power MOSFET comprises a number of unit cells, formed in a single semiconductor wafer 54 and electrically connected in parallel. The unit cells 52 have a common drain region 56 of N− conductivity type silicon semiconductor material having a common metal electrode 58 in ohmic contact through a highly-doped N+ conductivity type substrate 60. While silicon is the preferred semiconductor material, there are other possibilities, such as gallium arsenide.

The unit cells 52 have individual N+ conductivity type source 62 and P conductivity type base 64 regions formed within the drain region 56. At the wafer 54 surface 66, each base region 64 exists as a band 68 of P conductivity type semiconductor material between N type source 62 and drain 56 regions. In order to prevent turn on of the parasitic bipolar transistor formed by the N+ type source 62, P type base 64, and N− type drain 56 regions, a source-to-base short is provided comprising a shorting region 69 or extension of the base region 64 up through the source region 62 to the surface of the source region 62. The short is completed by a portion of the source metallization. While the FIG. 1 shorting extension 59 comprises a separate and definable P+ conductivity type region, the extension 69 may as well be of P conductivity type identical to the base region 64.

To produce an enhancement mode channel for field effect transistor operation, conductive gate electrodes, generally designated 70, separated by a gate insulating layer, generally designated 72, are positioned on the surface 66 at least over the band 68 of P conductivity type semiconductor material comprising the base region 64. Thus, between the gate electrodes 70, grooves are defined with the source 62 (and short 69) regions at the groove bottoms.

In one form, the gate insulating layer 72 is of sandwich construction. For reasons described below in detail, this form of gate insulating layer comprises a first oxide layer 74 comprising silicon dioxide, a nitride layer 76 comprising silicon nitride, and, if desired, a second oxide layer 78 also comprising silicon dioxide.

The conductive gate structure 70 has three conductive gate layers in the device 50 of FIG. 1. In particular, these are a conductive layer 80, a second conductive layer 82 having properties and alternative forms described hereinbelow in detail, and a gate metallization layer 84 comprising the third conductive layer. The sidewalls of the layer 80 of the gate electrode 70 are protected by a relatively thick oxide layer 86.

Preferably the gate electrode layer 80 comprises polysilicon highly-doped with either N+ or P+ conductivity type impurities, N+ conductivity type being illustrated. There are other materials, however, which may be employed for the conductive gate electrode layer 80, such as a metal silicide. Whatever material is employed, its general requirements are that it (1) be controllably oxidizable, (2) be etchable by a process or etchant which does not etch oxide, (3) have good conductivity, and (4) have a suitable good thermal expansion match to silicon.

While a variety of geometric structures are possible, preferably the gate electrodes 70 are elongated strips, and the metallization 84 comprises gate metallization fingers connected to a remote gate contact pad (not shown) at the same level.

Source metallization 88 comprises metal in ohmic contact with both the source region 62 and the shorting region 69 to effect ohmic contact between the source 62 and base 64 regions. Although not specifically illustrated, in plan view the completed device of FIG. 1 preferably comprises a recessed comb-like structure comprising the source metallization 88, with individual source metallization fingers each connected at one of their ends to a common recessed source contact pad. A raised comb-like structure comprising the gate metallization 84 is interdigitated with the recessed source metallization comb-like structure, with individual gate metallization fingers each connected at one of their ends to a common gate electrode facing the opposite direction with respect to the recessed source electrode.

The base 64, source 62 and shorting regions 69 of FIG. 1 reach their ultimate locations by means of thermal diffusion or driving steps hereinafter described. The approximate locations of these regions are depicted in FIG. 1 wherein it may be seen that the base surface portion 68 lies wholly beneath the conductive gate electrode 70, and there is accordingly overlap, as at 90, of the source region 62 beneath the conductive gate electrode 70. The diffusion processes must be controlled such that the overlap 90 is greater than or at least equal to zero; i.e., the overlap 90 must exist.

Figure 2A:
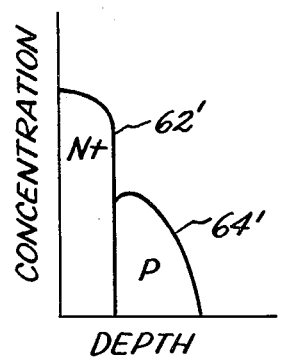
FIGS. 2A and 2B are graphs plotting semiconductor impurity concentration and conductivity type as a function of depth below the surface at the points designated A—A and B—B, respectively, in the device of FIG. 1.
Figure 2B:
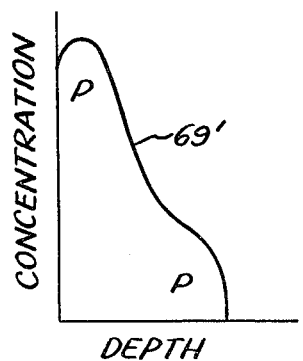

Similarly, appropriate concentration/depth profiles are depicted in FIGS. 2A and 2B. FIGS. 2A and 2B show semiconductor impurity concentration as a function of depth in the sections A—A and B—B respectively of FIG. 1. In FIG. 2A, the first line 62' depicts the concentration of the N+ conductivity type source region 62, and the second line 64' depicts the concentration of the P conductivity type base region 64. In FIG. 2B, depicting the concentration profile through the shorting region 69, a single line 69' depicts the manner in which the highly-doped P+ semiconductor type shorting 69 region merges into the P conductivity type base region 64.

In operation, each unit cell is normally non-conducting with a relatively high withstand voltage. When a positive voltage is applied to the gate electrode 70 via the gate terminal metallization 84, an electric field is created and extends through the gate insulating layer 72 into the base region 64, drawing electrons out of the P conductivity type base region 64 to form a thin N type conductivity channel just under the surface 66 below the gate electrode 70 and the insulating layer 72. As is known, the more positive the gate voltage, the more conductive this channel becomes and the more working current flows. Current flows horizontally near the surface 66 between the source 62 and drain 56 regions, and then vertically through the remaining drain region 56 and through the substrate 60 to the metal drain terminal 58.

Other Insulated-Gate Devices

As summarized hereinabove, the general MOSFET structure depicted in FIG. 1 is representative of insulated-gate semiconductor devices in general, to various of which the processes of the invention are equally applicable.

For example, to provide an Insulated Gate Rectifier (IGR), the substrate 60 would be of P+ conductivity type, as indicated alternatively in FIG. 1, and would comprise the rectifier anode region. The N− conductivity-type region 56 is then more generally herein termed a first region, and the substrate 60 is herein more generally termed a second region. The source region 62 comprises the rectifier cathode, and is herein more generally termed an upper terminal region.

Similarly, although not specifically illustrated, an MOS-gated thyristor may be provided by forming a third region (not shown), of N+ conductivity type, below a suitably P− doped conductivity type second region 60. The third region would then comprise a thyristor main terminal.

As will be appreciated, usual device manufacturing processes generally begin with the lower region layer, i.e., the third region in the case of a MOS-gated thyristor, and the upper layers are then successively formed such as by epitaxial growth techniques.

For convenience, the detailed processes of the invention are described hereinbelow with reference to a MOSFET, but it will be appreciated that the processes of the invention apply equally well to these and other forms of insulated-gate semiconductor devices in general.

IMPLANT PROCESS OF FIGS. 3-9

Figure 3:
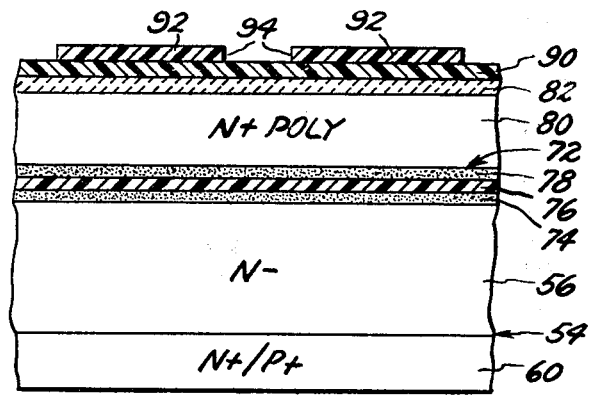
FIG. 3 generally depicts initial wafer preparation steps in a representative process in accordance with the invention.

With reference to FIG. 3, the silicon semiconductor wafer 54 including the drain region 56 of N− conductivity type is initially provided by starting with a suitable low resistivity wafer substrate 60, which may for example be a ten mil, 0.001 ohm-centimeter N+ conductivity type substrate. The drain region 56 is epitaxially grown over the wafer 60, and is for example two mils thick, with a twenty-five ohm-centimeter resistivity. This is a typical 500 volt structure.

Next, the gate insulating layer 62 is formed on the drain region 56 surface 66 by successively growing the first oxide layer 74, the nitride layer 76 and the second oxide layer 78. The oxide layers 74 and 78 may be grown by thermal oxidation and chemical vapor deposition, respectively. The nitride layer 76 may be grown by chemical vapor deposition. The nitride layer 76 is included to facilitate selective oxidation of the polysilicon gate 80 sidewalls, but may be omitted in process variations such as the one described hereinbelow with reference to FIGS. 12-16. The second gate oxide layer 78 is also optional, but is included to facilitate selective oxidation of the polysilicon gate electrode material while protecting the nitride layer 76 in that many polysilicon etchants attack silicon nitride, but are resisted by silicon dioxide. Further, this oxide layer 78 reduces mechanical stresses in the gate insulating layer 72 generally, and at the interface between the gate insulating layer 72 and the polysilicon layer 80.

Next, the conductive layer 80 of appropriate thickness for the gate electrode (e.g. 1.0 micron) is formed over the gate insulating layer 72. In this example, the conductive layer 80 comprises polysilicon highly-doped with either N+ or P+ type impurities. The layer 80 comprises the first conductive gate electrode layer.

Next, the overhang layer 82 is formed, which layer must be capable both of withstanding high temperature processing and of resisting polysilicon etchant. Preferably, the overhang layer 82 is a conductive layer which remains in the final device structure as the second conductive gate electrode layer. Alternatively, the layer 82 may be removed prior to device completion, exposing the tops of remaining portions of the polysilicon layer 80.

For an overhang layer 82 which is conductive, there are at least four variations contemplated by the subject invention. The first variation is simply a refractory metal layer of, for example, platinum, molybdenum, or tungsten. However, since these materials tend to oxidize during high temperature processing in the presence of oxygen, it is preferred that they be protected by another layer comprising silicon nitride or a sandwich of silicon nitride over silicon dioxide to implement a second variation. As a third variation, rather than a refractory metal, a refractory metal silicide, such as molybdenum silicide, may be employed as the second conductive gate layer 82. While molybdenum silicide also forms an oxide, it is self-protecting in that the oxide forms only on the surface, and protects the bulk of the material. The fourth variation and preferred form, and that which is specifically illustrated in FIG. 3, is a molybdenum silicide second conductive gate layer 82, in turn protected by a silicon nitride layer 90.

Subsequent to the initial preparation of the wafer 54, an etch resist mask 92 is formed on the overhang layer 82 (or over the nitride protective layer 90) employing conventional photolithographic techniques. The mask 92 preferably comprises elongated strips, with openings 94 therebetween defining the ultimate locations of source and base regions. A comparable mask, described hereinafter with reference to FIG. 37, is designated 206.

Figure 4A:
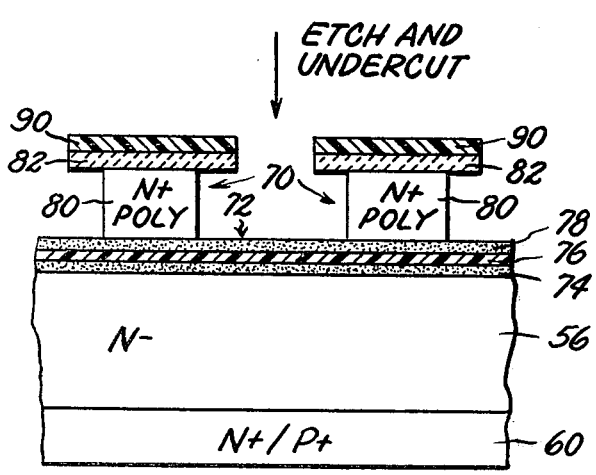
FIGS. 4A and 4B depict undercut (lateral) etching of the FIG. 3 wafer, FIG. 4A representing preferential etching and FIG. 4B representing isotropic etching.
Figure 4B:
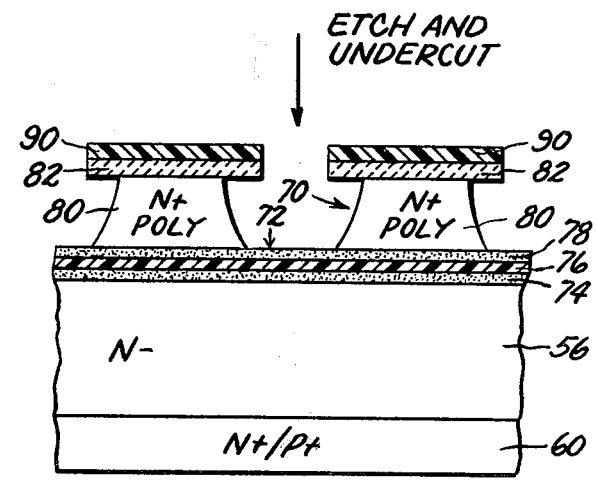

Next, and with reference to either FIG. 4A or 4B, the overhang layer 82 and the polysilicon gate layer 80 are both etched in the areas defined by the mask openings 94 down to the gate insulating layer 72. This step actually defines the polysilicon gate electrodes 70, which extend upwardly from and are spaced along the gate insulating layer 72. Significantly, the etching depicted in either FIG. 4A or 4B undercuts the overhang layer 82, leaving a deliberate overhang.

FIG. 4A illustrates the preferred form of etching, which is a preferential etch to form channels with substantially vertical walls beneath the mask openings 94. By way of example, polysilicon may be preferentially etched by any number of dry etch techniques, such as reactive ion etching, or ion milling.

The presence of the second oxide layer 78 aids in the etching process by protecting the nitride layer 76 from polysilicon etchant. For example, many plasma etches etch polysilicon well and silicon nitride fairly well, but stop at silicon dioxide.

Depending upon the particular etching process employed, subsequent lateral etching to form sufficient undercut may or may not be needed.

As illustrated in FIG. 4B, an isotropic etch may be done instead with satisfactory results, a suitable etchant, by way of example, being a liquid mixture of HF and HNO₃ diluted with H₂O. However, this may lead to larger cell sizes being required.

Next, as intermediate steps in the process, impurities appropriate to form the base region 64 of P conductivity type and the source region 62 of N+ conductivity type within the base region 64 are introduced into the drain region 56 between the polysilicon gate electrodes 70, with the polysilicon gate electrodes 70 serving as masks during the introduction of impurities. By the way of example, the preferred acceptor-type impurity for the base region 64 is boron. Suitable donor-type impurities for the source region 62 are phosphorus, arsenic and antimony.

Figure 5:
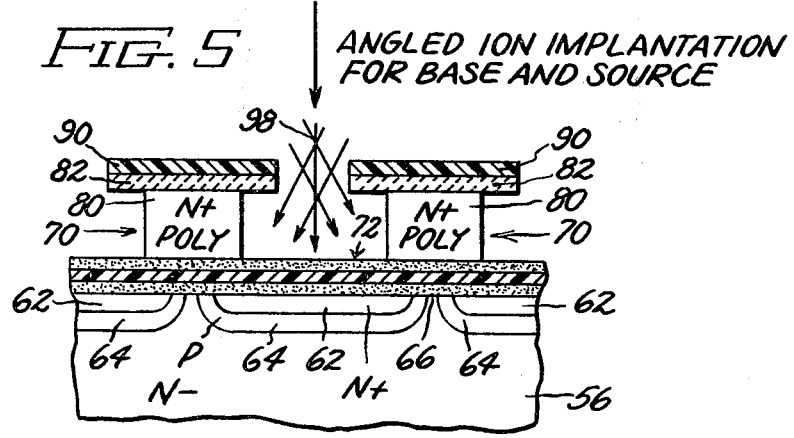
FIG. 5 depicts steps of introducing base region and source region impurities by means of ion implantation at angles.

As depicted in FIG. 5, in one process of the invention, this introduction of impurities is done by means of ion implantation at angles as indicated by the arrows 98 in FIG. 5 so as to cover substantially the entire active area of the drain region principal surface 66 except where masked by the polysilicon gate electrodes 70. Known ion implant processes may be employed, such as those described in J. F. Gibbons, "Ion Implantation in Semiconductors—Part I: Range Distribution Theory and Experiments", *Proc. IEEE,* Vol. 56, No. 3, pp. 295-319 (Mar. 1968); and J. F. Gibbons, "Ion Implantation in Semiconductors—Part II: Damage Production and Annealing", *Proc. IEEE,* Vol. 60, No. 9, pp. 1062-1096 (Sept. 1972).

Significantly, ion implantation of the base 64 and source 62 region impurities is done through the gate insulating layer 72, which remains substantially intact. At some point subsequent to implantation, the impurities are driven by thermal diffusion to appropriately locate the base 64 and source regions 62. This diffusion may be done all at once, or in stages. For convenience, FIG. 5 depicts the positions of the base 64 and source 62 regions after diffusion, and thus FIG. 5 does not accurately depict their locations immediately subsequent to implantation. Exemplary impurity concentration profiles are described hereinafter more fully with reference to FIGS. 8A-8C.

Preferably, diffusion of the base region 64 and source region 62 impurities to drive them to their ultimate locations is done simultaneously with a selective oxidation step depicted in FIG. 6. In the most efficient process all implants are done at the same time, and then all drive at the same time during the selective oxidation step.

More particularly, and with reference to FIG. 6, as an intermediate step in the process, the polysilicon gate electrode 70 sidewalls are selectively oxidized by heating in the presence of oxygen to grow the oxide layer 86, which is substantially thicker than the first oxide layer 74 of the gate insulating region layer 72. Oxidation of the source region 62 between the polysilicon gate electrodes 70 is masked by the nitride layer 76 in the gate insulating region layer 72 and oxidation of the polysilicon gate electrode upper surfaces is masked by the remaining portions of the second conductive gate layer 82, which in turn are preferably protected by the silicon nitride layer 90. As shown, the exposed edges of the second conductive gate layer 82 oxidize somewhat, but the layer 82 otherwise remains substantially intact. The resist layer 92 (FIG. 3) does not withstand the high temperature thermal oxidation and is removed prior to any high temperature step. Preferably, the second gate oxide layer 78 in the source region is selectively etched to expose the silicon nitride layer 74 prior to selective oxidation of the polysilicon gate 80 sidewalls. Further information concerning selective oxidation techniques may be found by reference to an article by J. Hui, T. Y. Chiu, S. Wong, and W. G. Oldham, "Selective Oxidation Technologies for High Density MOS", *IEEE Electron Device Letters,* Vol. EDL-2, No. 10, pp. 244-247 (October 1981).

Next, as another intermediate step in the process, the shorting extension 69 of the base region 64 is formed up through and to a portion of the surface of the source region 62 intermediate and spaced from the polysilicon gate electrodes 70 to facilitate an ohmic connection between the base 64 and source regions 62 when the source metallization 88 (FIG. 1) is applied. Significantly, in accordance with various alternative methods of the invention, the shorting region 69 is formed by employing the overhang of the second conductive gate electrode layer 82 as a mask to define the portion of the surface of the source region 62, thereby obviating the need for a separate mask.

More particularly, in FIG. 7 the shorting extension is formed by introducing into the drain region, by means of ion implantation, impurities appropriate to form the shorting region 69 of the opposite conductivity type laterally within the source region 62 and extending downwardly into the base region 64 so as to form an extension of the base region 64. The arrows 100 in FIG. 7 depict an ion implantation beam carrying, for example, acceptor-type impurities such as boron or indium so as to form the shorting region 69 of P+ conductivity type.

Specific examples of impurity concentration profiles are shown in FIGS. 8A, 8B and 8C. FIG. 8A plots concentration as a function of depth of P type impurities introduced to form the base region 64 as depicted in FIG. 5. In FIG. 8A, the solid line 102 depicts actual implant concentration, while the dash line 104 depicts concentration as a function of depth below the surface following thermal diffusion.

Similarly, FIG. 8B depicts the concentration as a function of depth for the N type impurities being introduced in higher concentration so as to form a more highly doped (N+) region. In FIG. 8B, the solid line 106 represents actual implantation dose, and the dash line 108 represents concentration after thermal diffusion.

Finally, FIG. 8C similarly indicates the concentration as a function of depth for the P type impurities forming the shorting region, the solid line 110 depicting the actual implant profile, and the dash line 112 depicting the profile following thermal diffusion.

By comparing the dash line curves 104, 108 and 112 of FIGS. 8A, 8B and 8C, it can be seen that the depth of the shorting extension 69 represented by the line 112 (FIG. 8C) extends past the source region 62 represented by the line 108 (FIG. 8B), but need not extend all the way through the base region 64 depicted by the line 104 (FIG. 8A). Generally, the deeper the diffusion for the shorting extension 69, the greater its lateral extent. The lateral extent must not become too great as it decreases the contact area to the N+ source region.

The concentration/depth profiles depicted in FIGS. 8A-8C may be achieved in a variety of specific ways as will be appreciated by those skilled in the art. For example, to form the N+ type source region 62 completely within the P type base region 64, the P type implant for the base region 64 is driven (thermally diffused) for a longer time period, is implanted deeper, or employs an impurity with a greater diffusion coefficient. So that the P+ short region 60 goes deeper than the N+ type source 62, a relatively slower diffusion donor impurity (e.g. antimony rather than phosphorus) may be selected for the source region 62.

Next, as a further intermediate step depicted in FIG. 9, the nitride 76 and oxide 74 and 78 (if still present) layers of the gate insulating layer 72 between the gate electrodes 70 are removed by selective etching employing a suitable etchant such as buffered hydrofluoric acid for oxides and hot phosphoric acid for nitride to expose bare silicon on the surface of the source region 62. Etching of the oxide layers 74 and 78 in the gate insulating region layer 72 is readily accomplished without removing the gate sidewall oxide layer 86 (formed as depicted on FIG. 6) because the gate sidewall oxide layer 86 is much thicker. While some etching occurs, it is not etched through.

Finally, if not removed by the previous etching steps, all mask and protective coatings over the second conductive gate electrode layers 82 are removed. Preferably, the nitride or other protective coating 90 on the second conductive gate layer 82 contains a somewhat thicker nitride than gate layer 76, but no oxide thicker than oxide layer 74. As a result, silicon in the source region 62 (including the short region 69) is exposed, and the upper portions of the second conductive gate layer portions 82 are exposed.

At this point, to arrive at the ultimate structure depicted in FIG. 1, metal, such as aluminum, is deposited, such as by evaporation, onto the wafer so as to form the metallized recessed source electrode terminals 88 in ohmic contact with the source region 62 and with the shorting extension 69, and metallized third conductive gate layer terminals 84 in ohmic contact with the gate structure.

The metallization is automatically separated into the higher region 84 over the gate terminals, and the lower region 88 over the source. To fully cover the exposed N+ conductivity type source region 62 (and not just the short region 69) the metallization is preferably done at approximately the same angles as the P type base and N+ short implants (FIG. 5, arrows 98). During the metallization, partial covering of the polysilicon gate sidewalls is not harmful due to the insulating oxide layer 86.

Drain contact metallization 58 (FIG. 1) is evaporated onto the substrate 60 at a convenient time to complete the device structure.

While the order of steps described immediately above with reference to FIGS. 1–9 is one which is preferred, it will be appreciated that a number of variations are possible. For example, the polysilicon gate sidewall oxidation step of FIG. 6 can precede the base and source implantation step of FIG. 5. Similarly, it will be appreciated that the implantation steps may be done in a different order, and may be done either through the gate insulating oxide layer 72, or after the layer 72 has been removed.

As another variation (not illustrated) the P+ short implant of FIG. 7 may be masked in strips at right angles to the grooves, resulting in local shorts, and providing a somewhat larger contact area between the N+ conductivity type source region 62 and the source metallization 88. This particular mask does not require critical alignment.

BASE AND SOURCE REGIONS FORMED BY GAS SOURCE DIFFUSION FIGS. 10–11

In the process described immediately above with reference to FIGS. 3–9, the base 64 and source 62 regions are formed by means of implantation. That process requires that the angled implants (FIG. 5) be done carefully so that the entire drain region between the polysilicon gate electrodes 70 is implanted. Otherwise, drain-to-source shorts may result if any source metallization 88 contacts the drain region 56 in areas not implanted.

To avoid this problem, as depicted in FIGS. 10 and 11 the base 64 and source 62 regions are alternatively formed employing gas source diffusion.

Specifically, as depicted in FIG. 10 initial preparation and the initial steps begin generally as before. However, the thick gate sidewall oxide 86 is selectively grown relatively early in the process, and then the gate insulating layer 72 in the region between the gate electrodes 70 is removed, leaving the drain region 56 exposed as depicted in FIG. 10.

In order for the second conductive gate layer 82 to remain protected from subsequent diffusion steps, at least some of its protective nitride layer 90 should remain. So that the nitride layer 90 survives the etching step which removes the nitride layer 76 in the gate insulating layer 72, the nitride layer 90 is preferably at least twice as thick as the nitride layer 76. Although preferred, it however is not strictly necessary that the nitride layer 90 survive, since selective oxidation to form the gate sidewall oxide layer 86 occurs prior to etching through the gate insulating layer 72.

At this point, with reference to FIG. 11, the base 64 and source 62 regions are formed by diffusion. First, a gaseous P type pre-deposition (for example with boron-nitride source wafers) is done, preferably growing no oxide. This step, using a gas source, ensures that there will be a P conductivity type layer wherever the drain region 56 is not covered by a gate electrode. The gaseous pre-disposition is preferably driven (at least partially) at this point. Next, the N type diffusion from a gas source such as $POCL_3$ is done to form the source region 62.

Next, the P+ conductivity type shorting region is formed, for example, by implantation as was described above with reference to FIG. 7, and the process continues as before.

PROCESSES AVOIDING SILICON NITRIDE IN THE GATE INSULATING LAYER FIGS. 12–16

In the processes described herein up to this point, in order to facilitate selective oxidation of the polysilicon gate electrode sidewalls, a silicon nitride layer 76 is included within the gate insulating layer 72. Although no purpose is served after the selective oxidation of the polysilicon gate electrode sidewalls, necessarily the unetched portions of this nitride layer 76 remain in the active portion of the gate insulating region between the conductive gate electrode 70 and the surface 66 of the base region 64.

It has been found that silicon dioxide/silicon nitride sandwiches can have built-in charges or unstable charges due, to change mostly thought to be located at the nitride/oxide interface. These charges are sufficient to create difficulties in MOS structures containing them, for example, by making it difficult to invert the conduction channel.

Accordingly, in accordance with this alternative of the invention no nitride layer is included within the gate insulating oxide layer formed during initial wafer preparation, and a nitride oxidation mask layer is formed at a later intermediate step in the process.

More specifically, with reference to FIG. 12 a silicon semiconductor wafer is initially provided as before, including a drain region 56. However, rather than the sandwich-type gate insulating layer 72 of FIG. 1, a single gate insulating oxide layer 120 is formed on the drain region surface 66. Thereafter, a first conductive gate electrode layer 80 of highly-doped polysilicon and a second conductive gate layer 82 of molybdenum silicide are formed as described above, protected by a nitride layer 90, followed by a mask (not shown). It will be appreciated that the initial preparation steps differ from those described hereinabove with reference to FIGS. 3 and 4A only in that no silicon nitride is included in the gate insulating layer.

Also as depicted in FIG. 12, the polysilicon gate electrode layer 80 is next etched down to the gate oxide layer 120, with undercutting of the second conductive gate layer 82.

As shown in FIG. 13, as an intermediate step in the process, impurities are introduced to form the source 62 and base regions 64. Thesse regions may be formed by any of the methods previously described, either by ion implantation or gas source diffusion. In the example of FIG. 13, the source 62 and base 64 regions are formed by gas source diffusion and, accordingly, the gate insulating oxide layer 120 is first removed in the area between the polysilicon gate electrodes 70, thereby exposing bare silicon.

As shown in FIG. 14, at this point a silicon nitride oxidation mask layer 121 is formed over the source region between the polysilicon gate electrodes 70 so as to facilitate selective oxidation of the polysilicon gate electrode 70 sidewalls. As described in the above-referenced Hui et al article entitled "Selective Oxidation Technologies for High Density MOS", there are a variety of ways in which the nitride oxidation mask layer 121 may be formed. As one example, the nitride mask 121 is formed by ion implantation, at an angle so as to cover the entire source region between the polysilicon gate electrodes 70, but yet avoiding the polysilicon gate electrode sidewalls. With ion implantation processes, the nitrogen is implanted just into the silicon or, in the event the oxide layer 120 has not yet been removed, into both the oxide and the silicon.

Alternatively, the nitride mask 121 may be formed by low pressure chemical vapor deposition. Yet another alternative is sputtering. Preferential growth techniques, or angled vapor direction should be employed to avoid forming a nitride layer on the polysilicon gate 70 sidewalls.

Represented in FIG. 15 is the actual selective oxidation step to form the thick oxide layer 86 on the polysilicon electrode 70 sidewalls. Oxidation of the source region 62 is prevented by the nitride mask layer 121 and oxidation of the polysilicon gate upper surfaces is prevented by the second conductive gate layer portions 82.

Next, as depicted in FIG. 16, the shorting region 69 is formed, and the nitride selective oxidation mask layer 121 is removed, in either order. Illustratively, in FIG. 16 the shorting region 69 is formed by a vertical ion implant as described above with reference to FIG. 7, although it will be appreciated that other methods may be employed, as described more fully hereinafter.

At this point, the FIG. 16 wafer is ready for the final steps of ensuring that silicon in the source region 62 and that the upper surfaces of the second conductive gate layer portions 82 are exposed. Terminal metallization is deposited on the wafer surface to form a structure as depicted in FIG. 1, except that there is no nitride layer in the gate insulating layer.

ALTERNATIVE PROCESSES WITHOUT NITRIDE SELECTIVE OXIDATION MASK

The processes of the invention may be relaxed somewhat, at the expense of requiring another masking step, by neither including the silicon nitride layer 76 in the gate insulating layer as described hereinabove with reference to FIGS. 3-11, nor forming the nitride oxidation mask 121 later as described hereinabove with reference to FIGS. 12-16. Rather, the source region 62 surface is allowed to oxidize at the same time the gate sidewall oxide 86 is grown, and source contact windows are later formed by removal of the source region oxide. Typically, the source contact windows are opened employing a precisely-aligned mask as is conventionally done. Other processes might also be employed, such as reactive ion etching or ion milling with a collimated beam having a high selectivity ratio for silicon dioxide over silicon.

In any event, the critically-aligned masking step conventionally required for source-to-base short formation is avoided in accordance with the processes of the invention.

FORMATION OF SOURCE-TO-BASE SHORTS

In the processes described thus far, the requisite source-to-base short is provided by forming a shorting region 69 by means of a vertical implant, as is described above with reference to FIG. 7. However the P+ short implant may be somewhat difficult as, in order to function as a short, it must convert the N+ source 62 to P+ conductivity type.

In accordance with the invention, a number of other approaches are contemplated, appropriate in combination both with gas source diffused source regions, and with implanted source regions. These are described next hereinbelow as alternatives.

In all but one of the alternatives described hereinbelow, the P+ implant is eliminated in favor of local self-registered masking of the N+ source implant or diffusion, as the case may be.

FIRST SOURCE-TO-BASE SHORT ALTERNATIVE—FIGS. 17-19

FIGS. 17-19 illustrate intermediate steps in a process for forming the source-to-base short where the source region 62 is formed by angled implantation.

As depicted in FIG. 17, initial steps of this process proceed as described above, up through selective oxidation of the polysilicon gate 70 sidewalls and through the step of etching the gate insulating layer 72 in the ultimate source region between the polysilicon gate electrodes 70.

Next, with reference to FIG. 18 impurities are introduced to form the base region 64. This may be either by ion implantation or gas source diffusion, the latter being depicted in FIG. 18 in view of the prior removal of the gate insulating layer 72. The diffusion to form the base region 64 is done while growing minimal oxide on the surface 66.

Finally, as depicted in FIG. 19, a self-registered implant mask 122 is formed by evaporating metal vertically onto the wafer, using the overhang of the overhang layer 82 as a mask during evaporation deposition. The metal for the self-registered implant mask 122 may be either a refractory metal or mere aluminum. Upon subsequent implantation of the source region 62 impurities as represented by the arrows 123, the area protected by the self-registered implant mask 122 is not implanted, resulting in the desired shorting extension 69 of the base region 64.

The mask 122 is removed, and the remaining steps in this particular process alternative then proceed as described hereinabove. Where mask 122 comprises the refractory metal molybdenum, for example, a suitable etchant for removing such molybdenum mask 122 comprises, by way of example, a liquid mixture of $5H_3PO_4$ and $3HNO_3$ diluted with $2H_2O$.

SECOND SOURCE-TO-BASE SHORT ALTERNATIVE—FIGS. 20-22

As an illustrative alternative to the process described just above with reference to FIGS. 17-19, in FIGS. 20-22 the base 64 and source 62 regions are both formed by angled implants, but prior to removal of the gate insulating layer 72.

FIG. 20 begins this illustration with the wafer in its condition subsequent to the initial steps of the process, with the polysilicon gate electrode layer 80 etched down to but not through the gate insulating layer 72. P type impurities for the base region 64 are then introduced by means of angled ion implantation through the gate insulating layer 72.

In FIG. 21, the base region 64 impurities are driven by thermal diffusion, and at the same time the oxide layer 86 is formed on the polysilicon gate electrode 70 sidewalls by selective thermal oxidation as before.

As shown in FIG. 22, the self-registered implant mask 122 is formed in the same manner as was described above with reference to FIG. 19, again utilizing the overhang layer 82 as a mask. At this point, impurities appropriate to form the source region 62 are introduced by angled ion implantation through the gate insulating layer, with the area protected by the self-registered implant mask 122 not covered.

At this point, the gate insulating layer 72 is etched away between the gate electrodes 70, and the wafer metallized as before.

THIRD SOURCE-TO-BASE SHORT ALTERNATIVE—FIGS. 23-26

FIGS. 23-26 illustrate intermediate steps in a process for forming the shorting extension 69 without the use of an implant, and wherein the source region 62 is formed by gas source diffusion.

FIG. 23 illustrates the wafer after initial processing, the gate sidewall oxide 86 having been grown, and the gate insulating layer 72 between the polysilicon gate electrodes 70 having been removed. Also depicted in FIG. 23 is a step of P type base impurity pre-deposition, from a gas source, with minimal oxide growth.

Next, with reference to FIG. 24, a silicon nitride layer 124 is formed on the entire exposed surface, for example employing conventional chemical vapor deposition techniques.

Next, with reference to FIG. 25, a self-registered metal etchant mask 126 is formed over a portion 124' of the silicon nitride layer 124. This self-registered mask 126 is formed by evaporating and depositing metal substantially vertically with the overhang of the overhang layer 82 serving as a mask during evaporation deposition. It will be appreciated this particular step is in the same manner as was described above with reference to FIGS. 19 and 22 for forming the implant mask 122.

Still with reference to FIG. 25, a nitride diffusion mask is formed by selectively etching to remove the silicon nitride layer and any oxide on the exposed surface except for masked by the etchant mask 126. Selective etching follows to remove the metal etchant mask 126.

Next, as depicted in FIG. 26, source region 62 impurities are introduced from a gas source, except where masked by the nitride diffusion mask 124'. All the same time, the impurities for both the source 62 and base 64 regions are driven to their final locations.

The nitride diffusion mask 124' is then removed and the process continues as described above.

FOURTH SOURCE-TO-BASE SHORT ALTERNATIVE—FIGS. 27-28

In the embodiment of FIGS. 23-26 described above, a nitride diffusion mask 124' is formed prior to the source diffusion by means of a three-step process (FIGS. 24-26) involving forming a uniform nitride layer 124, forming a self-registered metal etchant mask 126, and etching the nitride layer 124 except where masked. In the embodiment of FIGS. 27-28, these three steps are replaced by a single step of directly implanting nitrogen ions to form a self-registered silicon nitride diffusion mask 127. As represented by the FIG. 27 arrows 128, the ion implantation is done vertically, with the overhang of the overhang layer 82 serving as a mask during ion implantation. Then, as depicted in FIG. 28, source region 62 impurities are introduced from a gas source, except where masked by the mask 127. At the same time, the impurities for both the source 62 and base 64 regions are driven, leaving the shorting extension 69.

The nitride diffusion mask 127 is then removed, and the process continues as described above. In this particular process it may not be possible to remove all of the silicon nitride comprising the mask 127 due to its being implanted. However, it is possible to remove the mask 127 sufficiently to provide adequate contact when the source metallization 88 (FIG. 1) is applied.

FIFTH SOURCE-TO-BASE SHORT ALTERNATIVE—FIG. 29

FIG. 29 illustrates an alternative for forming the shorting extension by employing sharply-angled source implants. In particular, in FIG. 29, the base region 64 has been formed by any of the preceding processes, preferably by angled implant through the gate insulating layer 72. At this point, source region 62 impurities are introduced by ion implantation at much sharper angles than before as indicated by the arrows 129 such that an intermediate region 130 on the surface 66 is shadowed and therefore not implanted. The shorting extension 69 of the base region 64 thus results. With this process, due to the sharp angles, impurities are implanted into the polysilicon gate electrodes 70. However, this causes no particular problems due to the high doping level in the polysilicon. Should the implantation cause problems, the sidewall oxide can be grown first.

From the geometry of FIG. 27, it will be appreciated that the overhang layer 82 is not employed in the same manner as before as a mask. With sufficiently acute source ion implantation angles, the overhang is not needed.

ENCASED GATE ELECTRODE DEVICES

With reference now to FIG. 30, there is shown in cross section the active portion of a second general form of MOSFET device 200, which may be fabricated in accordance with three-mask processes of the invention, described hereinbelow with particular reference to FIGS. 31-37, in addition to various of the process steps already described hereinabove with reference to FIGS. 3-29.

In overview, the device 200 of FIG. 30 is electrically similar to the device 50 of FIG. 1, the primary difference being that the polysilicon gate electrodes 70 are completely encased in a protective oxide layer 202, including both sidewalls and tops. Source metallization 204 covers the entire active portion of the wafer, including the encased polysilicon gate electrode 70. Accordingly, remote gate contacts are required, resulting in a higher gate input resistance. (Although not illustrated herein, it may be noted that a refractory metal silicide layer may be included in an encased gate electrode structure to provide higher gate resistance. An example of such a structure is specifically described in the above-incorporated Temple application Ser. No. 406,738.)

Differences also lie in the nature of the specific fabrication processes. The processes to form the device 50 of FIG. 1 may be characterized as one-mask processes, while the processes to form the device 200 of FIG. 30 are three-mask processes, due particularly to the need to form remote gate contacts, and to pattern the metallization.

However, the processes described hereinbelow to form the device 200 of FIG. 30 have a number of advantages. In particular, there is no need to form a protective layer on the top surfaces of the polysilicon gate electrodes 70 which is capable of withstanding high temperature processing. No masking layer need survive high temperature processing in several specific forms.

ANGLED SOURCE AND BASE IMPLANTS IN THREE-MASK PROCESS FIGS. 31-35

By way of example, described hereinbelow is a three-mask, encased gate electrode process which involves angled implantation of source and base region impurities.

Referring to FIG. 31, initial preparation includes providing a silicon semiconductor wafer having a drain region 56 as before, a gate insulating region 72 and a polysilicon gate electrode layer 80. In contrast to all processes described in detail hereinabove with reference to drawing FIGS. 1-29, an overhang layer 220 is formed which does not remain in the final device structure, and which need not be conductive. Specifically, in FIG. 31 the overhang layer 220 comprises a polysilicon oxide layer 220 formed over the polysilicon gate electrode layer 80. An etch resist mask 206 is then formed on the polysilicon oxide layer 220.

As depicted in FIG. 32, the polysilicon oxide overhang layer 220 is selectively etched to form portions 220', and then the polysilicon layer 80 is etched down to the gate insulating layer 72, with deliberate undercutting of the polysilicon oxide overhang layer 220, to form polysilicon gate electrodes 70.

At this point in the process, the structure of FIG. 32 is comparable to the structure of FIG. 4A described hereinabove, except for the nature of the overhang layer. In particular, rather than a second conductive gate layer 82 (FIG. 4A) comprising molybdenum silicide, there is simply a thick oxide layer 220 (FIG. 32).

At this point, as illustrated in FIG. 33, the base 64, source 62 and short regions are formed by any of the processes described hereinabove, preferably ion implantation, with angled implantation to form the source 62 and base 64 regions and vertical implantation to form the short region 69.

Next, any remaining portions of the first photoresist mask 206 are removed, as well as the polysilicon oxide overhang portions 220', achieving the structure of FIG. 34.

Next, the gate electrode 70 tops and sidewalls are selectively oxidized to grow the encasing oxide layer 202, resulting in the structure of FIG. 35.

At this point, the device is ready for final processing to expose the source 62 and short regions 69 for metallization, to open gate contact windows, to metallize, and to implement metallization patterning. In particular, with reference to FIG. 36 the gate insulating layer 72 is removed between the gate electrodes 70 to expose the short region 69 and portions of the source region 62. As is known this is done by means of a first mask 206, the outline of which may be seen in FIG. 37. Remote gate contact openings are made through the encasing oxide layer 202 on a portion of the wafer other than at the location of the active region of the device 200. As is known this is done by means of a second mask 208, the outline of which may be seen in FIG. 37.

Metal 204 is then evaporated onto the entire wafer as depicted in FIG. 30, and then patterned employing a third mask 210 (FIG. 37) to separate the metallization into source and gate regions.

CONCLUSION

From the foregoing, it will be appreciated that a variety of processes and process variations have been described to achieve the objects set forth. It will be appreciated that a large number of individual process steps have been described and that these may be done in various combinations and in various orders, other than those specifically described hereinabove.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

I claim:

1. A self-aligned process for manufacturing an insulated-gate semiconductor device including an integral short, said process comprising:
    providing a semiconductor wafer including a first region of one conductivity type having a principal surface, and preparing the wafer by forming on the principal surface a gate insulating region layer, forming on the gate insulating region layer a conductive gate electrode layer, and forming on the conductive gate electrode layer an overhang layer;
    forming an etch resist mask having openings defining the ultimate location of upper electrode regions, and then etching in areas defined by the mask openings through the overhang layer and through the conductive gate electrode layer at least to the gate insulating region layer, with lateral etching of the conductive gate electrode layer to undercut the overhand layer, thereby defining gate electrodes extending upwardly from and spaced along the first region principal surface, with overhanging portions of the overhang layer on the upper surfaces of the gate electrodes;

oxidizing at least the conductive gate electrode sidewalls;

introducing into the first region between the gate electrodes impurities appropriate to form a base region of opposite conductivity type and an upper electrode region of the one conductivity type within the base region, the gate electrodes serving as masks during the introduction of impurities, and diffusing the impurities introduced to appropriately locate and configure the base and upper electrode regions such that at the principal surface the base region exists as a band of opposite conductivity type between the upper electrode region and the first region, with active portions of the band underlying at least a portion of at least one gate electrode and being separated therefrom by portions of the gate insulating region layer;

forming a shorting extension of the base region up through and to a portion of the surface of the upper electrode region intermediate and spaced from the gate electrodes to facilitate an ohmic connection between the base and upper electrode regions, the forming of the shorting extension being accomplished by employing the overhang of the overhang layer as a mask to define said portion of the surface of the upper electrode region; and forming a metallized gate terminal in electrical contact with the conductive gate electrodes, and forming a metallized upper electrode region terminal in electrical contact with the upper electrode region and with the shorting extension.

2. A process in accordance with claim 1, wherein the steps of introducing base region and upper electrode region impurities comprise ion implantation at angles so as to implant the entire active area of the first region principal surface except where masked by the gate electrodes.

3. A process in accordance with claim 2, wherein the steps of ion implantation are carried out prior to removal of the gate insulating region layers and the ion implantation is through the gate insulating region layers.

4. A process in accordance with claim 2, wherein the step of forming a shorting extension of the base region comprises introducing into the first region by means of of ion implantation impurities appropriate to form a shorting region of the opposite conductivity type laterally within the upper electrode region but extending downwardly into the base region, implantation of the shorting region impurities being accomplished substantially vertically with the overhang of the overhang layer serving as a mask such that only a portion of the first region principal surface between the gate electrodes is implanted.

5. A process in accordance with claim 4, wherein the overhang layer provided comprises a refractory metal silicide.

6. A process in accordance with claim 5, wherein the step of preparing the wafer further comprises forming a protective layer of silicon nitride over the refractory metal silicide overhang layer.

7. A process in accordance with claim 6, wherein the step of forming a shorting extension of the base region comprises subsequent to introduction of base region impurities but prior to implanting upper electrode region impurities, forming a self-registered implant mask over a portion of the surface between the gate electrodes by evaporating and depositing metal substantially vertically with the overhang of the second conductive gate electrode serving as a mask during evaporation deposition such that, upon subsequent implantation of the upper electrode region impurities, the area covered by the self-registered implant mask is not implanted.

8. A process in accordance with claim 1, wherein the step of forming a shorting extension of the base region comprises introducing into the first region by means of ion implantation impurities appropriate to form a shorting region of the opposite conductivity type laterally within the upper electrode region but extending downwardly into the base region, implantation of the shorting region impurities being accomplished substantially vertically with the overhang of the overhang layer serving as a mask such that only a portion of the first region principal surface between the gate electrodes is implanted.

9. A process in accordance with claim 1, wherein at least the step of introducing base region impurities comprises gas source diffusion to ensure coverage of the entire active area of the first region principal surface except where masked by the gate electrodes.

10. A process in accordance with claim 1, wherein the steps of introducing base region and upper electrode region impurities comprise gas source diffusion to ensure coverage of the entire active area of the first region principal surface except where masked by the gate electrodes.

11. A process in accordance with claim 10, wherein the step of forming a shorting extension of the base region comprises introducing into the first region by means of ion implantation impurities appropriate to form a shorting region of the opposite conductivity type laterally within the upper electrode region but extending downwardly into the base region, implantation of the shorting region impurities being accomplished substantially vertically with the overhang of the overhang layer serving as a mask such that only a portion of the first region principal surface between the gate electrodes is implanted.

12. A process in accordance with claim 11, wherein the overhang layer provided comprises a refractory metal silicide.

13. A process in accordance with claim 12, wherein the step of preparing the wafer further comprises forming a protective layer of nitride over the refractory metal silicide overhang layer.

14. A process in accordance with claim 1, wherein the steps of introducing base region and upper terminal region impurities and forming a shorting extension of the base region comprise:

first, providing a bare semiconductor surface in the region between the gate electrodes;

second, pre-depositing base region impurities on the bare semiconductor surface from a gas source while growing minimal oxide;

third, forming a nitride layer on the entire exposed surface between the gate electrodes;

fourth, forming a self-registered metal etchant mask over a portion of the nitride layer on the exposed surface by evaporating and depositing metal substantially vertically with the overhang of the overhang layer serving as a mask during evaporation deposition;

fifth, forming a nitride diffusion mask by selectively etching to remove the nitride layer and any oxide on the exposed surface except where masked by the etchant mask, and then selectively etching to remove the metal etchant mask;

sixth, introducing and diffusing upper electrode region impurities from a gas source except where masked by the nitride diffusion mask; and seventh, removing the nitride diffusion mask.

15. A process in accordance with claim 14, wherein the overhang layer provided comprises a refractory metal silicide.

16. A process in accordance with claim 15, wherein the step of preparing the wafer further comprises forming a protective layer of silicon nitride over the refractory metal silicide overhang layer.

17. A process in accordance with claim 1, wherein the steps of introducing base region and upper electrode region impurities and forming a shorting extension of the region comprise:

first, providing a bare semiconductor surface in the region between the gate electrodes;

second, pre-depositing base region impurities on the bare semiconductor surface from a gas source while growing minimal oxide;

third, forming a self-registered nitride diffusion mask on a portion of the surface between the gate electrodes by introducing nitrogen by means of substantially vertical ion implantation, with the overhang of the overhang layer serving as a mask during implantation;

fourth, introducing and diffusing upper electrode region impurities from a gas source where masked by the nitride diffusion mask; and fifth, removing the nitride diffusion mask.

18. A process in accordance with claim 1, wherein the steps of introducing base region and source region impurities comprise:

first, providing a bare semiconductor surface in the region between the gate electrodes;

second, diffusing from a gas source base region impurities into the region between the gate electrodes while growing minimal oxide; and third, introducing by means of ion implantation impurities appropriate to form the upper electrode region, implantation of the upper terminal region impurities being accomplished at angles so as to implant the entire area between the gate electrodes.

19. A process in accordance with claim 18, wherein the step of forming a shorting extension of the base region comprises subsequent to introduction of base region impurities but prior to implanting upper electrode region impurities, forming a self-registered implant mask over a portion of the surface between the gate electrodes by evaporating and depositing metal substantially vertically with the overhang of the overhang layer serving as a mask during evaporation deposition, such that upon subsequent implantation of the upper terminal region impurities the area covered by the self-registered implant mask is not implanted.

20. A process in accordance with claim 19, wherein the overhang layer provided comprises refractory metal silicide.

21. A process in accordance with claim 20, wherein the step of preparing the wafer further comprises forming a protective layer of silicon nitride over the refractory metal silicide overhang layer.

22. A process in accordance with claim 1, wherein the overhang layer is formed of a conductive material in electrical contact with the conductive gate electrode layer and at least portions of the overhang layer remain in the final device structure.

23. A process in accordance with claim 22, wherein the overhang layer provided comprises a refractory metal.

24. A process in accordance with claim 23, wherein the step of preparing the wafer further comprises forming a protective nitride layer over the refractory metal of the overhang layer.

25. A process in accordance with claim 22, wherein the overhang layer provided comprises a refractory metal silicide.

26. A process in accordance with claim 25, wherein the step of preparing the wafer further comprises forming a protective layer of silicon nitride over the refractory metal silicide overhang layer.

27. A process in accordance with claim 22, which comprises removing all non-conductive layers over the upper electrode region and ensuring that an insulating layer is provided over the overhang layer portions such that the gate electrodes are encased in insulation, providing another mask with a window defining at least one gate contact area on a portion of the wafer other than at an active device region, employing the window in the other mask to etch through the insulating layer over the gate electrode area to form a contact opening, removing the other mask, evaporating metal onto the wafer, and patterning by means of yet another mask to define separate upper electrode region terminals and gate electrode terminals.

28. A process in accordance with claim 1, wherein
the gate insulating region layer is formed including at least one oxide layer and a nitride layer covering the oxide layer; and wherein
the step of oxidizing at least the gate electrode sidewalls comprises thermally selectively oxidizing the gate electrode sidewalls to grow an oxide layer thicker than the one oxide layer in the gate insulating region layer, with oxidation of the upper electrode region between the gate electrodes being masked by the nitride layer in the gate insulating region layer; and
said process further comprises removing the nitride and oxide layers of the gate insulating layer region between the gate electrodes to expose semiconductor in the upper electrode region.

29. A process in accordance with claim 1, wherein
the step of oxidizing at least the gate electrode sidewalls comprises thermally selectively oxidizing the gate electrode sidewalls by forming a nitride oxidation mask layer over the upper electrode region between the polysilicon gate electrodes; and
said process further comprises removing the nitride oxidation mask layer and the gate insulating layer region between the gate electrodes to expose semiconductor in the upper electrode region.

30. A process in accordance with claim 29, wherein the nitride oxidation mask layer is formed by ion implantation.

31. A process in accordance with claim 29, wherein the nitride oxidation mask layer is formed by directional low pressure vapor deposition.

32. A process in accordance with claim 29, wherein the nitride oxidation mask layer is formed by sputtering.

33. A process in accordance with claim 1, which comprises removing all non-conductive layers over the upper electrode region and over the gate electrodes, and wherein the metallized upper electrode region terminal and the gate electrode terminal are formed by depositing metal onto the wafer surface to form automatically separated areas of metallization over the upper electrode region and over the gate electrode.

34. A process in accordance with claim 1, which comprises removing all non-conductive layers over the upper electrode region and providing an insulating layer over the gate electrodes such that the gate electrodes are encased in insulation, providing another mask with a window defining at least one gate contact area on a portion of the wafer other than at an active device region, employing the window in the other mask to etch through the insulating layer over the gate electrode area to form a contact opening, removing the other mask, evaporating metal onto the wafer, and patterning by means of yet another mask to define separate upper electrode region terminals and gate electrode terminals.

35. A self-aligned process for manufacturing an insulated-gate semiconductor device including an integral short, said process comprising:

providing a semiconductor wafer including a first region of one conductivity type having a principal surface, and preparing the wafer by forming on the principal surface a gate insulating region layer and forming on the gate insulating region layer a conductive gate electrode layer;

forming an etch resist mask having openings defining the ultimate location of upper electrode regions, and then etching in areas defined by the mask openings through the gate electrode layer at least to the gate insulating region layer, thereby defining gate electrodes extending upwardly from and spaced along the first region principal surface;

oxidizing at least the gate electrode sidewalls;

introducing into the first region between the gate electrodes impurities appropriate to form a base region of opposite conductivity type and an upper electrode region of the one conductivity type within the base region, and diffusing the impurities introduced to appropriately locate and configure the base and upper electrode regions such that at the principal surface the base region exists as a band of opposite conductivity type between the upper electrode region and the first region, with active portions of the band underlying at least a portion of at least one gate electrode and separated by portions of the gate insulating layer, the base region impurities being first introduced, and the upper electrode region impurities being subsequently introduced by ion implantation at sharp angles such that the surface between the gate electrodes is covered except for an intermediate portion shadowed by the gate electrodes, the unshadowed intermediate portion being a shorting extension of the base region up through and to a portion of the surface of the upper electrode region intermediate and spaced from the gate electrodes to facilitate an ohmic connection between the base and upper electrode regions; and forming a metallized gate terminal in electrical contact with the gate electrodes, and forming a metallized upper electrode region terminal in electrical contact with the upper electrode region and with the shorting extension.

* * * * *